United States Patent [19]
Gruen et al.

[11] Patent Number: 5,772,760
[45] Date of Patent: Jun. 30, 1998

[54] METHOD FOR THE PREPARATION OF NANOCRYSTALLINE DIAMOND THIN FILMS

[75] Inventors: Dieter M. Gruen, Downers Grove; Alan R. Krauss, Naperville, both of Ill.

[73] Assignee: The University Of Chicago, Chicago, Ill.

[21] Appl. No.: 540,916

[22] Filed: Oct. 11, 1995

Related U.S. Application Data

[63] Continuation-in-part of Ser. No. 143,866, Oct. 27, 1993, Pat. No. 5,620,512, which is a continuation-in-part of Ser. No. 35,419, Mar. 23, 1993, Pat. No. 5,370,855, which is a continuation-in-part of Ser. No. 797,590, Nov. 25, 1991, Pat. No. 5,209,516.

[51] Int. Cl.[6] ..................................................... C30B 31/06
[52] U.S. Cl. .......................... 117/104; 117/108; 117/929; 427/577
[58] Field of Search .................................... 117/104, 108, 117/929; 427/375, 577; 423/446

[56] References Cited

U.S. PATENT DOCUMENTS

| | | |
|---|---|---|
| 4,559,901 | 12/1985 | Morimoto et al. |
| 4,634,600 | 1/1987 | Shimizu et al. |
| 4,816,286 | 3/1989 | Hirose |
| 5,015,494 | 5/1991 | Yamazaki |
| 5,132,105 | 7/1992 | Remo |
| 5,209,916 | 5/1993 | Gruen |
| 5,273,788 | 12/1993 | Yu |
| 5,328,676 | 7/1994 | Gruen |
| 5,360,477 | 11/1994 | Inoue et al. |
| 5,370,855 | 12/1994 | Gruen |
| 5,449,531 | 9/1995 | Zhu et al. ................................ 117/929 |
| 5,462,776 | 10/1995 | Gruen |
| 5,529,815 | 6/1996 | Lemelson ................................ 427/475 |

OTHER PUBLICATIONS

Cheng et al., "Fabrication and Charaterizing of Diamond – Clad Silicon", Japanese Journal of Applied Physics, Part I, vol. 34, No. 12B, pp. 6926–31.

*J. Mater. Res.*, Jan./Feb. 1988, pp. 133–139, "Growth mechanism of vapor–deposited diamond," Authors: Frenklach et al.

*J. Chem, Phys.*, Dec. 1990, p. 7800, "Laser Deposition of Carbon Clusters on Surfaces: A New Approach to the Study of Fullerenes," Authors: Gerard Meijer and Donald S. Bethune.

*Annu. Rev. Mater. Sci.*, vol. 21, 1991, pp. 221–248, "Metastable Growth of Diamond and Diamond–Like Phases," Angus, Wang and Sunkara.

*J. Phys. Chem*, vol. 95, 1991, pp. 8402–8409, "Resilience of All–Carbon Molecules $C_{60}$, $C_{70}$ and $C_{84}$ : A Surface–Scattering Time–of–Flight Investigation," Author: Beck, St. John, Alvarez, Diedrich and Whetten.

*Mat. Res. Soc. Symp. Proc.* vol. 208, 1991 Materials Research Society, "Spectrometric Characterization of Purified $C_{60}$ and $C_{70}$, "Authors: Lykke et al.

*Chem, Rev., 1991, 91, pp. 1213–1235, "$C_{60}$ Buckminsterfullerene"* Authors: Kroto et al.

*Reprint from Inorganic Chemistry*, 1991, "Superconductivity at 28.6K in a Rubidium–$C_{60}$ Fullerene Compound, $Rb_xC_{60}$, Synthesized by a Solution–Phase Technique," pp. 2962–2963.

*Reprint from Inorganic Chemistry*, 1991, First Easily Reproduced Solution–Phase Synthesis and Confirmation of Superconductivity in the Fullerene $K_xC_{60}$ , pp. 2838–2839.

*Popular Science*, Aug. 1991, pp. 52–87, "Buckyball, The Magic Molecule" Author: Edward Edelson.

(List continued on next page.)

*Primary Examiner*—Robert Kunemund
*Attorney, Agent, or Firm*—Emrich & Dithmar

[57] ABSTRACT

A method and system for manufacturing nanocrystalline diamond film on a substrate such as field emission tips. The method involves forming a carbonaceous vapor, providing a gas stream of argon, hydrocarbon and possibly hydrogen, and combining the gas with the carbonaceous vapor, passing the combined carbonaceous vapor and gas carrier stream into a chamber, forming a plasma in the chamber causing fragmentation of the carbonaceous vapor and deposition of a diamond film on the field emission tip.

30 Claims, 34 Drawing Sheets

OTHER PUBLICATIONS

*Scientific American*, Oct. 1991, p. 54, "Fullerenes," Authors: Robert F. Curl and Richard E. Smalley.

*J. Chem. Phys.*, vol. 95, Nov. 1, 1991, pp. 7008–7010, "Delayed electron emission from photoexcited $C_{60}$," Authors: Wurz et al.

*Chemical Physics Letters*, Dec. 20, 1991, "Near Specular Reflection of $C_{60}$ Ions in Collisions with an HOPG Graphite Surface," Authors: Busmann, Lill and Hertel.

*Appl. Phys. Lett.*, Dec. 23, 1991, p. 3461, "Nucleation of Diamond Films on Surfaces Using Carbon Clusters," Authors: R.J. Meilunas and R.P.H. Chang.

*Nature*, vol. 355, Jan. 16, 1992, p. 237, "Crushing $C_{60}$ to Diamond at Room Temperature," Authors: Reguerio, Monceau and Hodeau.

*Scientific American*, vol. 267, Oct. 1992, p. 84, "Diamond Film Semiconductors," Authors: Michael W. Geis and John C. Angus.

*Nature*, vol. 347, 27 Sept. 1990, pp. 354–358, "Solid $C_{60}$ : A New Form of Carbon", Kratschmer, Lamb, Fostiropoulos and Huffman.

60 nm

Diamond (100) (2x1):H

C2 Dimer Insertion: Step 1

C2 Dimer Insertion: Step 2

Second C2 Dimer Inserted

C2 Trough Insertion: Step 1

C2 Trough Insertion: Step 2

$H_2(98) - CH_4(2)$ $Ar(98) - C_{60}-H_2(2)$

000
METHOD FOR THE PREPARATION OF NANOCRYSTALLINE DIAMOND THIN FILMS

This application is a continuation-in-part of Ser. No. 143,866 filed Oct. 27, 1993, U.S. Pat. No. 5,620,512, which is a continuation-in-part of Ser. No. 35,419, filed Mar. 23, 1993, U.S. Pat. No. 5,370,855, which is a continuation-in-part of Ser. No. 797,590 filed Nov. 25, 1991, U.S. Pat. No. 5,209,916.

The United States Government has rights in this invention pursuant to Contract W-31-109-ENG-38 between the U.S. Department of Energy and the University of Chicago.

The present invention is directed generally to a system and method for manufacturing thin film coatings of diamond on field emission tips and other geometrical surfaces. Such diamond films are prepared from carbon precursors in a noble gas or noble gas/hydrogen gas atmospheres. More particularly, the invention is concerned with a system and method for applying diamond films to a field emission tip and other substrates. These diamond films are prepared by dissociation of a gaseous carbonaceous compound using an excited plasma which contains the carbonaceous compound and a noble gas, a combination of noble gases or a noble gas/hydrogen gas mixture. The carbonaceous compound can comprise at least one of fullerene, methane, acetylene or anthracene.

Diamond films exhibit a combination of outstanding properties including exceptional hardness, thermal conductivity, electrical resistance, chemical inertness, optical transmittance, electrical carrier mobility and dielectric breakdown strength. These outstanding physical and chemical properties have led to widespread efforts to develop improved methods of manufacturing diamond films. Prior art methods have been directed to chemical vapor deposition using a hydrogen gas atmosphere and high substrate temperatures, about 800° C.–1000° C. The hydrogen gas is dissociated into atomic hydrogen in the reaction vessel, and the atomic hydrogen is then reacted with various carbon containing compounds to form condensable carbon radicals, including $CH_3$ which is deposited to form the diamond layers. The resulting diamond layers are typically quite rough and have large grain size (about 5–10 microns). Typically, such diamond films are grown using about one mole percent of a hydrocarbon precursor (such as methane) in a hydrogen gas atmosphere. It is conventionally accepted that a large excess of hydrogen gas is essential for the diamond thin film growth process.

In such conventional methods of manufacture, hydrogen in varying amounts is invariably incorporated into the growing diamond film which gives rise to a variety of structural, electronic and chemical defects relative to bulk diamond. Although it is known that diamond film manufactured using hydrogen introduces such defects, experimental results and theoretical works on growth mechanisms conclude that substantial hydrogen must be present during diamond film growth processes. For example, it has been shown that diamond film can be obtained using CO and $CO_2$ gas after exposing the initially produced deposits periodically to hydrogen in order to remove nondiamond carbon deposits. Methods of manufacture using methane-argon or methane-helium atmospheres have also been employed, but resulted only in formation of graphite or diamond-like carbon films, not diamond. Other researchers used methane-helium mixtures, but obtained growth of diamond films only when a methane-helium discharge atmosphere was alternated with a hydrogen-oxygen-helium discharge atmosphere. Further research work has determined that the alleged lower limit for diamond film growth in the $CO$—$H_2$ system required at least 25 mole percent hydrogen gas. Finally, although defects arise from the presence of hydrogen, various theoretical approaches have concluded that hydrogen is a necessary part of the reaction steps in forming diamond film in chemical vapor deposition reactions.

In other methodologies smooth films can be grown at low substrate temperatures, such as room temperature, and in the absence of hydrogen. However, such processes do not form a true diamond structure, rather forming "amorphous" diamond or "diamond-like" films. In other processes nanocrystaline diamond has been successfully grown in $H_2$—$CH_4$ plasmas by increasing the $CH_4/H_2$ ratio, but the result is an increase in graphitic character and the production of a "cauliflower" type of microstructure having properties which do not lend itself to useful commercial applications.

It is therefore an object of the invention to provide an improved system and method for manufacturing diamond films for coating selected substrates.

It is another object of the invention to provide a novel system and method for manufacturing diamond film coated substrates by using a plasma of a noble gas, or a noble gas/hydrogen mixture and a hydrocarbon gas or fullerene compound.

It is an additional object of the invention to provide an improved system and method for manufacturing diamond film coated substrates employing a plasma atmosphere of argon, 0–20% hydrogen and $CH_4$ or $C_2H_2$.

It is also another object of the invention to provide an improved system and method of manufacturing a diamond film coated field emission tip.

It is yet a further object of the invention to provide a novel system and method of manufacturing a substrate coated with a nanocrystalline, regular shaped grains of diamond substantially free of graphite.

It is in addition an object of the invention to provide an improved diamond film coated article of manufacture grown by use of argon, argon/hydrogen or argon/methane, ethylene or anthracene mixtures at low substrate temperature, above about 470° C.

It is a further object of the invention to provide a novel system and method for manufacturing a diamond film by chemical vapor deposition from decomposition of molecules to form carbon dimers which promote the growth of diamond.

It is yet another object of the invention to provide an improved system and method for manufacturing a diamond film from a fullerene molecular gas decomposed by collisions in a noble gas or mixed noble gas/hydrogen plasma.

It is still an additional object of the invention to provide a novel system and method for manufacturing a diamond film by excitation of an argon or argon/hydrogen gas mixture to metastable states able to transfer energy to a fullerene or hydrocarbon molecule causing decomposition to form the diamond film.

It is also an object of the invention to provide an improved method and system for making a diamond film by microwave energy decomposition of fullerene molecules or compounds consisting of hydrocarbon gases in the presence of a noble gas, such as argon, also in combination with hydrogen.

It is also an object of the invention to provide an improved method and system for making a diamond film by decomposition of fullerene molecules or compounds consisting of hydrocarbon gases in the presence of a noble gas, such as argon, also in combination with hydrogen.

It is still a further object of the invention to form an abrasion resistant diamond coating by carbon dimer decomposition onto a substrate.

These and other objects of the invention will be described in detail in the detailed description provided herein below and taken in conjunction with the drawings described below.

DETAILED DESCRIPTION OF PREFERRED EMBODIMENTS

Figure 1A:
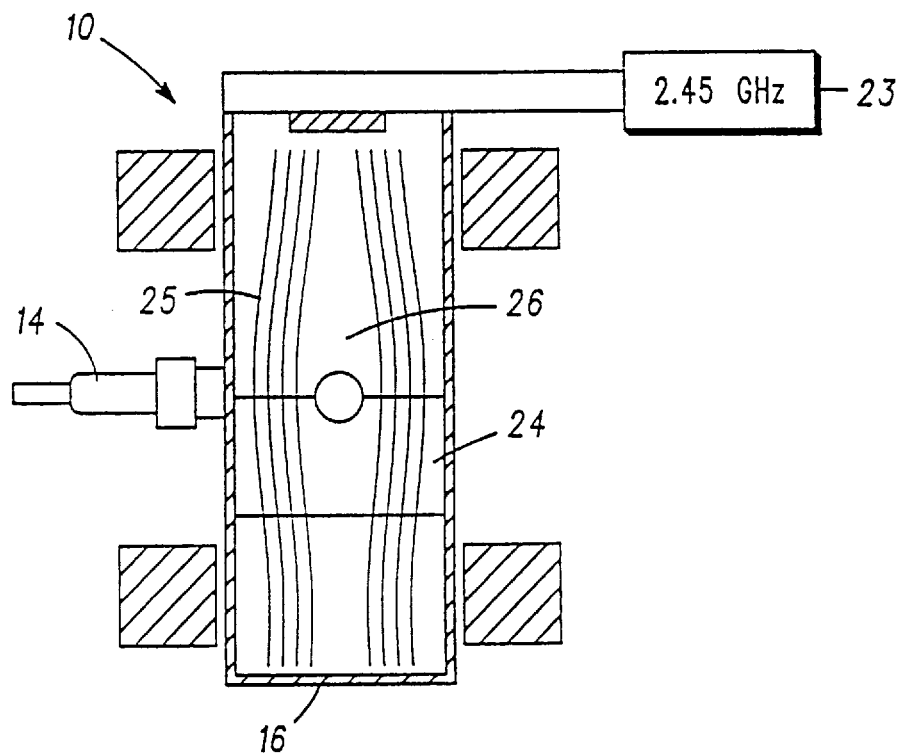
FIG. 1 illustrates a system constructed in accordance with one form of the invention for manufacturing diamond film.
Figure 1B:
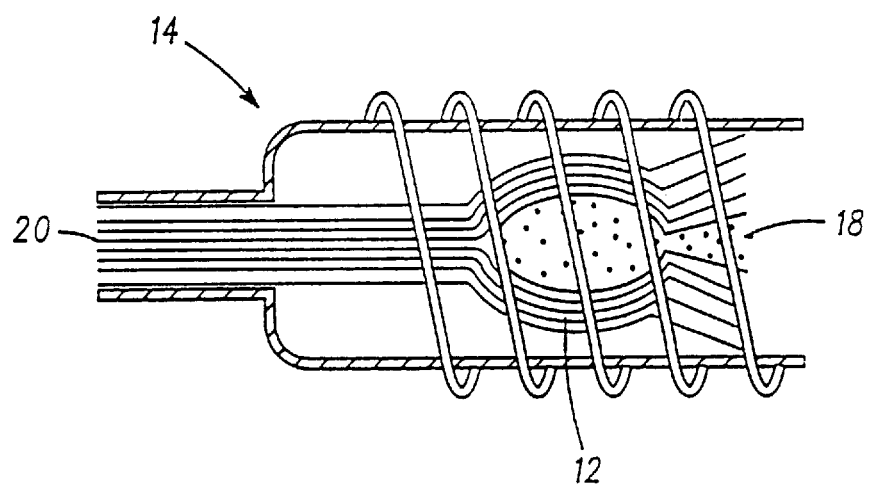

A microwave plasma deposition system 10 (hereinafter "system 10") constructed in accordance with one form of the invention is illustrated in FIG. 1. The system 10 is based on a ASTeX (PDS-17) commercial plasma deposition apparatus manufactured by Applied Science and Technology. Fullerene containing soot 12 used as a starting material was treated to remove hydrocarbon contaminants by contact with methanol. The treated soot 12 was then thoroughly degassed by conventional vacuum and/or thermal treatment (such as heating at 200° C. for 2 hours). The degassed soot 12 was placed in a sublimator 14 which is coupled to plasma deposition chamber 16, and the volume of the sublimator 14 is also coupled to the volume of the plasma deposition chamber 16. Thus, fullerene containing vapor 18 can be introduced into the plasma deposition chamber 16 by heating the sublimator 14 (for example, by Pt resistance wire heating) to a temperature adequate to cause fullerene sublimation (such as, about 550° C. to 600° C.). A noble carrier gas (such as argon) and lower percentages (0–19%) of hydrogen are introduced through gas inlet 20 enabling the gas mixture to transport the sublimed fullerene containing vapor 18 into the plasma deposition chamber 16.

A substrate 22 was used to accumulate deposited carbon as a diamond layer on the substrate 22. The substrate 22 can be a single crystal silicon wafer, or one of various metals or ceramics. The substrate 22 can also be disposed on a graphite stage 24, which not only can support the substrate 22 but can act as a heating element to control the substrate temperature. Using a microwave generator 23, a microwave field 25 is established within the plasma deposition chamber 16 in order to generate an excited plasma 26. A variety of gas mixtures and other experimental conditions were utilized to produce diamond layers, and a sampling of representative values are shown in Table 1. Films labeled A–E were grown to comparable thickness to allow direct comparison. Films F and G were grown to examine properties of thick films grown under the same conditions, Film G was grown under conventional $H_2$—$CH_4$ conditions, and a bare silicon substrate was tested for comparison. Diamond film growth was monitored in situ using laser reflectance interferometry to determine growth rate and to allow stopping film growth at a selected thickness.

TABLE 1

| Film | Sample ID# | $H_2$ Flow sccm | Ar Flow sccm | $CH_4$ Flow sccm | $C_{60}$ T-furn °C. | Pres. Torr | Power W | Substr Temp °C. | Growth Rate μm/hr | Diamond Thickness μm | RMS Roughness nm | Friction Coef. | Wear Rate × $10^{-6}$ $mm^3$/Nm |
|---|---|---|---|---|---|---|---|---|---|---|---|---|---|
| A | 940825 | 2 | 100 | 0 | 600 | 100 | 1500 | 850 | 0.3 | 1.7 | 30 | 0.12 | 0.014 |
| B | 940926B | 10 | 90 | 0 | 630 | 100 | 1500 | 850 | 0.9 | 2.0 | 105 | 0.18 | 0.15 |
| C | 940927 | 2 | 98 | 0 | 630 | 100 | 1500 | 850 | 0.25 | 2.0 | 41 | 0.04 | 0.1 |
| D | 940928 | 10 | 90 | 0.8 | 20 | 100 | 1500 | 850 | 0.8 | 2.0 | 125 | 0.21 | 0.88 |
| E | 940929 | 1.5 | 98 | 0.8 | 20 | 100 | 1500 | 850 | 0.5 | 2.3 | 53 | 0.08 | 0.4 |
| F | 941013 | 2 | 100 | 1 | 20 | 100 | 800 | 850 | 0.7 | 10 | 45 | — | — |
| G | 950802 | 98 | 0 | 2 | 20 | 60 | 1500 | 800 | 0.5 | 6 | 376 | 0.3 | 5.5 |
| Silicon | — | — | — | — | — | — | — | — | — | 0 | <3 | 0.42 | 1.2 |

The system 10 operates to deposit diamond on the substrate 22, and the diamond samples produced were characterized by a variety of conventional materials characterization techniques, such as, X-ray diffraction, Auger electron spectroscopy (AES), electron diffraction, transmission and scanning electron microscopy, atomic force microscopy (AFM), electron energy loss spectroscopy, Raman spectroscopy. In addition, various wear rate tests were performed (see Table 1).

Raman spectra of the films were measured with a Renishaw Raman microscope using a HeNe laser at 632.8 nm with an output of 25 mW focused to a spot size of about 2 nm. Raman spectroscopy is widely used to characterize diamond films, although the small grain sizes in these films has a significant effect on the Raman spectrum. Raman spectroscopy revealed a band centered at 1333 $cm^{-1}$ and a broad band feature at about 1550 $cm^{-1}$. The 1333 $cm^{-1}$ band is characteristic of all diamond films regardless of grain size, and the 1550 $cm^{-1}$ band feature is also commonly observed from small grain size diamond films.

Figure 2:
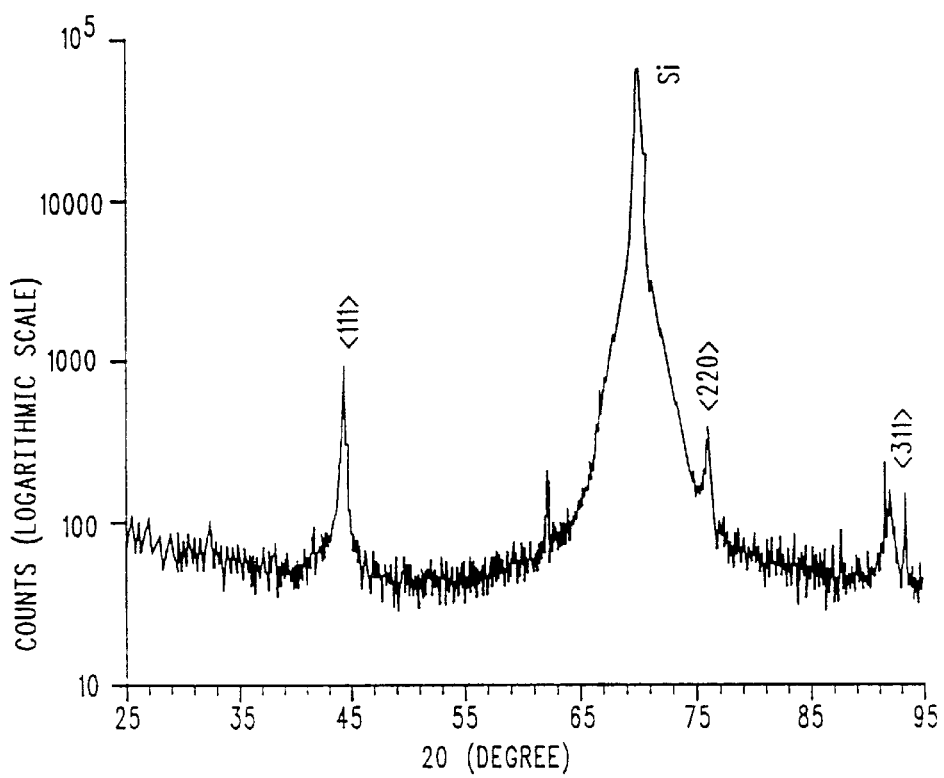
FIG. 2 illustrates an X-ray diffraction pattern for a diamond film on a silicon substrate with diamond grown by one method of the invention.

A Phillips powder diffractometer with $CuK_\alpha$ radiation was used for XRD measurements to ensure the presence of diamond and check for evidence of crystalline graphite. X-ray diffraction examination of the diamond layers showed the three major diamond diffraction peaks corresponding to the (111), (220) and (311) reflections (see FIG. 2). Particular regions of the diamond layer were also examined by selected area electron diffraction and confined the lattice of the film was a face centered cubic structure with lattice constant of 3.53±0.10 Angstroms (the accepted diamond lattice constant is 3.56 Angstroms).

AES spectra were obtained using a Physical Electronics model 548 spectrometer with a double pass cylindrical mirror analyzer. The carbon KLL peak shape is sensitive to the bonding state of carbon, providing a qualitative means of assessing the $sp^2/sp^3$ ratio of the films. Near-edge extended X-ray absorption fine structure (NEXAFS) spectroscopy reveals structures corresponding to graphitic ($sp^2$) electron bonding between carbon atoms (286 eV), hydrogen-carbon bonding (288 eV) and diamond ($sp^3$) bonding between carbon atoms (290 eV). TEM imaging was performed in the JEOL 4000EXII operating at 400 kV. Specimens for TEM were prepared using standard dimpling and ion milling procedures. The surface was characterized using a Burleigh ARIS-3300 AFM to measure the rms surface roughness and a JEOL JXA-840A SEM to image the surface.

Friction and wear tests (see Table 1 for results) were performed with pairs of silicon nitride balls and diamond-coated silicon substrates on a ball-on-disk tribometer. Tests were run in dry nitrogen environments. A Plexiglas cover was fitted over the tribometer, permitting ultra dry environments to be created. Several specimens without the diamond films were also tested, primarily to assess and compare their tribological performance to those with a diamond film. The dead weight applied to the balls was 2N. Frictional force was monitored with the aid of a linear variable-displacement-transducer and was recorded on a floppy disk via a data acquisition system throughout the tests. The rotational velocity was kept between 50 to 150 r/min. to provide sliding velocities of 25 to 40 mm/s. Sliding distance was 200 m. Wear-volume measurements on the balls were based on microscopic determination of the diameter of the circular wear scars. The wear of disk specimens was estimated from the traces of surface profiles across the wear tracks. Duplicate tests were run under conditions described above to check the reproducibility of the friction and wear data.

Figure 12A:
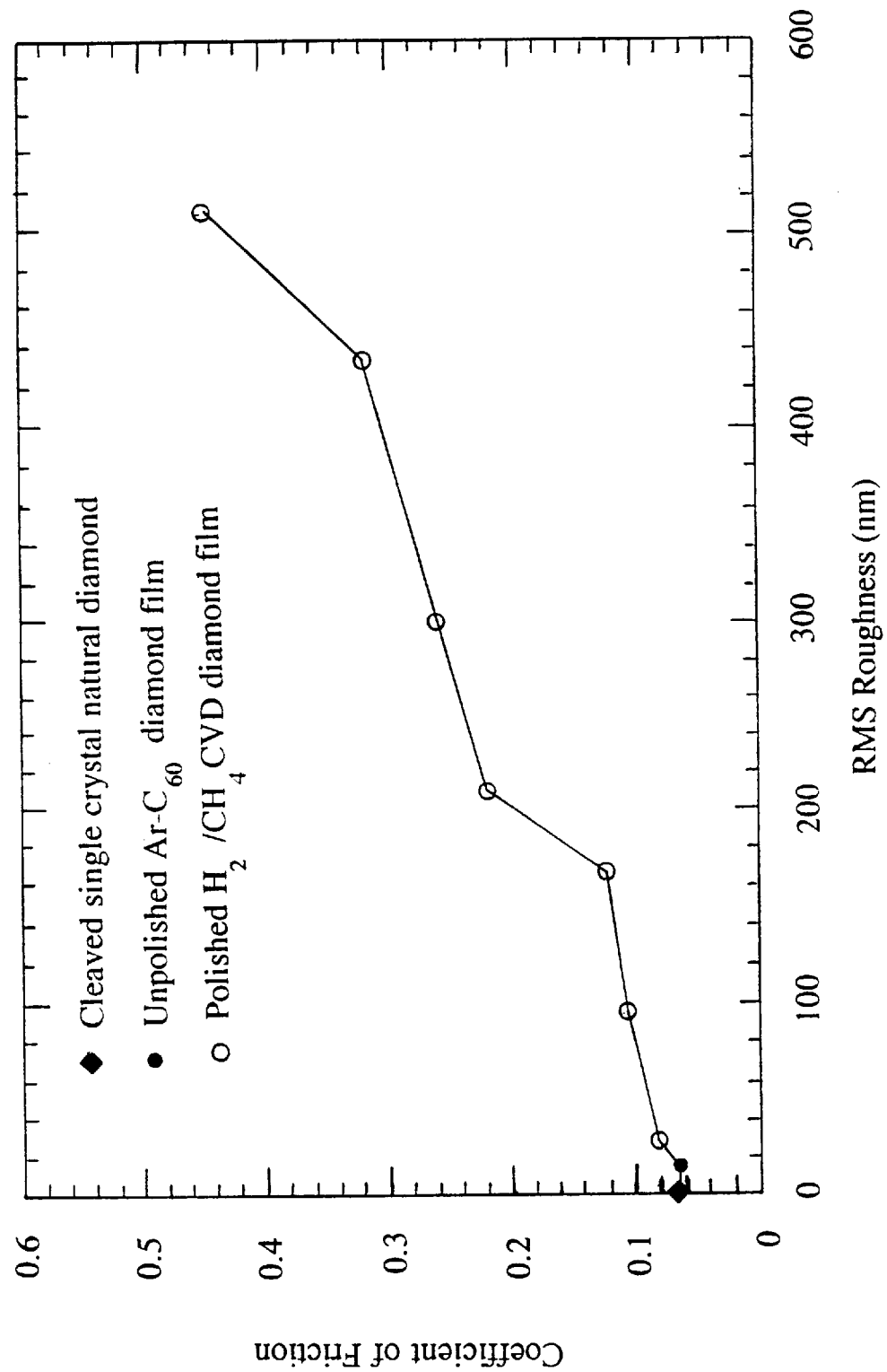
FIG. 12A shows the friction coefficient of polished CVD diamond film as a function of surface roughness. Also shown are the measured friction coefficients of a cleaved single crystal natural diamond and an as-deposited diamond film deposited using an Ar—$C_{60}$ plasma. There is a strong correlation between the surface roughness and friction coefficient, and the Ar—$C_{60}$ film is close in both properties to the cleaved single crystal diamond sample.
Figure 12B:
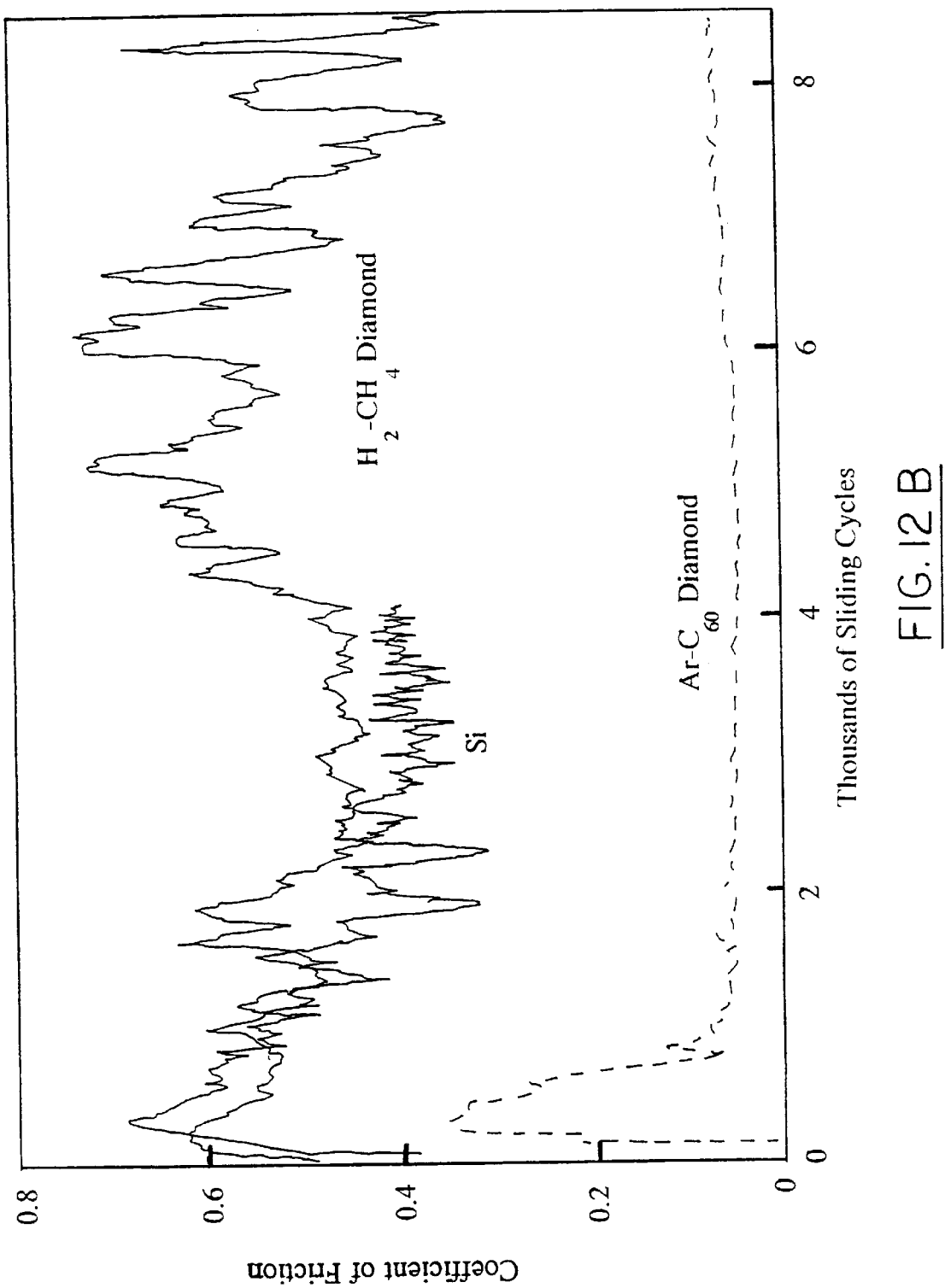
FIG. 12B shows the variation of the friction coefficients of Films C, D and an uncoated silicon substrate during sliding against $Si_3N_4$ balls in dry $N_2$ under a 2N load; Film C achieves a friction coefficient comparable to cleaved single crystal national diamond.

Conventional $H_2$—$CH_4$ (no argon) deposition of CVD diamond thin films results in rough films which must be polished in order to obtain a smooth surface. Since diamond is the hardest known material, this task, depending on the geometry of the surface, ranges from difficult to impossible. FIG. 12A shows the friction coefficient of polished CVD diamond film as a function of surface roughness. Also shown are the measured friction coefficients of a cleaved single crystal natural diamond and an as-deposited diamond film deposited using an Ar—$C_{60}$ plasma. There is a strong correlation between the surface roughness and friction coefficient, and the Ar—$C_{60}$ film is close in both properties to the cleaved single crystal diamond sample. The measured friction coefficients for samples A and F in Table I as well as the uncoated Si substrate are shown in FIG. 12B. Referring to Table I and FIG. 12B, it can be seen that for a given carbon precursor, the hydrogen concentration in the plasma strongly affects the roughness and wear rates. The lowest friction and wear coefficients are obtained for low plasma hydrogen concentrations, and the films grown from the $C_{60}$ precursor tend to be smoother than those grown from the $CH_4$ precursor.

Figure 4:
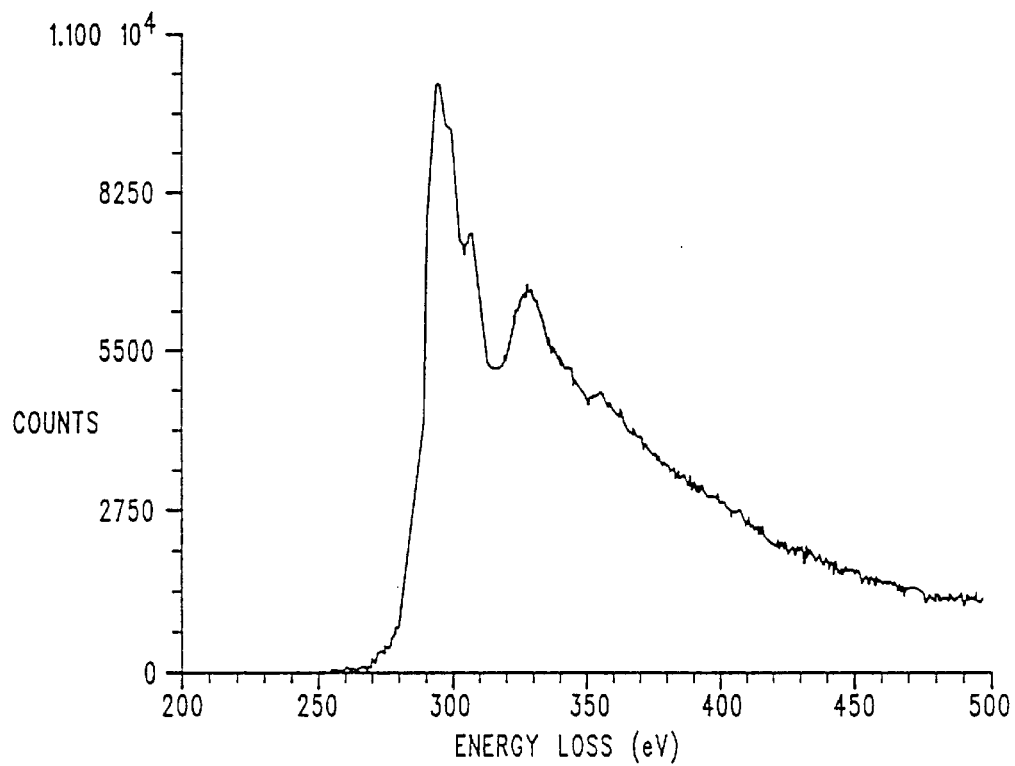
FIG. 4 illustrates an electron energy loss spectrum from a diamond film grown in accordance with one form of the invention.
Figure 5:
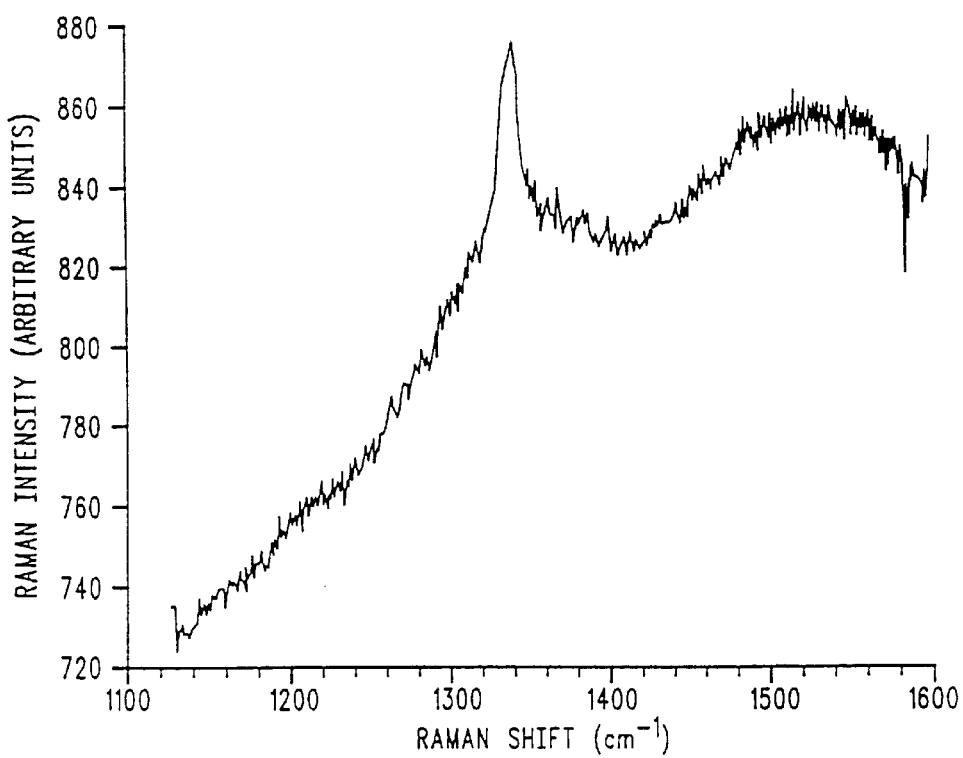
FIG. 5 illustrates a Raman spectrum from a diamond film grown in accordance with one form of the invention.

Transmission electron microscopy further determined that the diamond film was very fine-grained (~15 nm diameter), and the intergranular boundaries are free from graphitic contamination. Further characterization was performed by electron energy loss spectroscopy. The deposited specimen layers were examined, and a K-edge absorption peak was identified at about 291 eV, with no evidence of a graphite or amorphous carbon peak at 285 eV (see FIG. 4).

In another embodiment of the invention, additional diamond films were grown in the system 10 (a microwave plasma chemical vapor deposition reactor, ASTeX PDS-17 as previously described). The films were grown on silicon substrates polished with 0.1 $\mu$m diamond particles to enhance nucleation. In-situ diagnostics included plasma emission spectroscopy and surface reflectivity measurements. Raman spectroscopy was performed on the films ex-situ to ensure that diamond films were in fact grown.

Emission from the plasma was collected with a quartz optical fiber by viewing a region 1–2 cm above the substrate 22. The light was transmitted to an Interactive Technology model 103 optical monochromator with entrance and exit slit widths of 50 $\mu$m and 400 $\mu$m respectively. The monochromator was stepped in 2.3 Å increments with a dwell time of 100 msec from 3000 Å to 8000 Å. The dispersed light was detected with a Peltier-cooled photomultiplier tube. The reflectivity of the growing film surface was measured using a 5 mW HeNe laser. The reflected beam was passed through a HeNe laser line filter to eliminate plasma emissions and detected with a photodiode. The oscillations in the reflectivity were used to calculate the film thickness as a function of time and thus provide a measure of the growth rate. A Macintosh IIci was used to control the spectrometer and acquire data from both the spectrometer and photodiode. Raman measurements of the films were performed with a Renishaw Raman microscope using a HeNe laser at 6328 Å.

Plasma emission is observed when atoms or molecules in a plasma are excited to higher energy electronic states which decay mainly by radiative processes. The excited states may also decay by collisional quenching, and for larger molecules, by intermolecular nonradiative processes. Thus, many of the species in the plasma which are or interest, for example $CH_3$. and $C_2H_2$, cannot be detected by plasma emission measurements. The emission intensity, proportional to the excited state population of the species, is somewhat difficult to relate to the ground state population because changes in plasma conditions can produce changes in the emission intensity of a species by changing not only the ground state population, but also the excitation rate and the competing deexcitation mechanisms such as quenching. This makes use of plasma emission somewhat difficult for quantitative measurement of ground state species concentrations. Nevertheless, it is believed that the very large changes in emission by $C_2$ relative to other emitting species observed in our experiments, especially those with similar excitation energies, are in fact correlated with an increase in the ground state $C_2$ population. The species observed by plasma emission in these experiments are listed in Table 2. The increases in $C_2$ emission intensity relative to H, Ar, and CH are evidence of an increase in the ground state concentration of $C_2$ in the plasma, though not necessarily a linear increase.

TABLE 2

| Species | Transition | Wavelength Å | Excited State Energy (eV) |
| --- | --- | --- | --- |
| H | $^2P^o3/2 \rightarrow ^2S1/2$ | 6560 | 12.1 |
| Ar | $4_p'[1/2]_o \rightarrow 4s'[1/2]1^o$ | 7504 | 13.5 |
| $C_2$ | $d^3\Pi_g \rightarrow a^3\Pi_u$ | 5165(0-0) | 2.5 |
| CH | $A^2\Delta \rightarrow X^2\Pi_r$ | 4314(0-0) | 2.9 |

Figure 13:
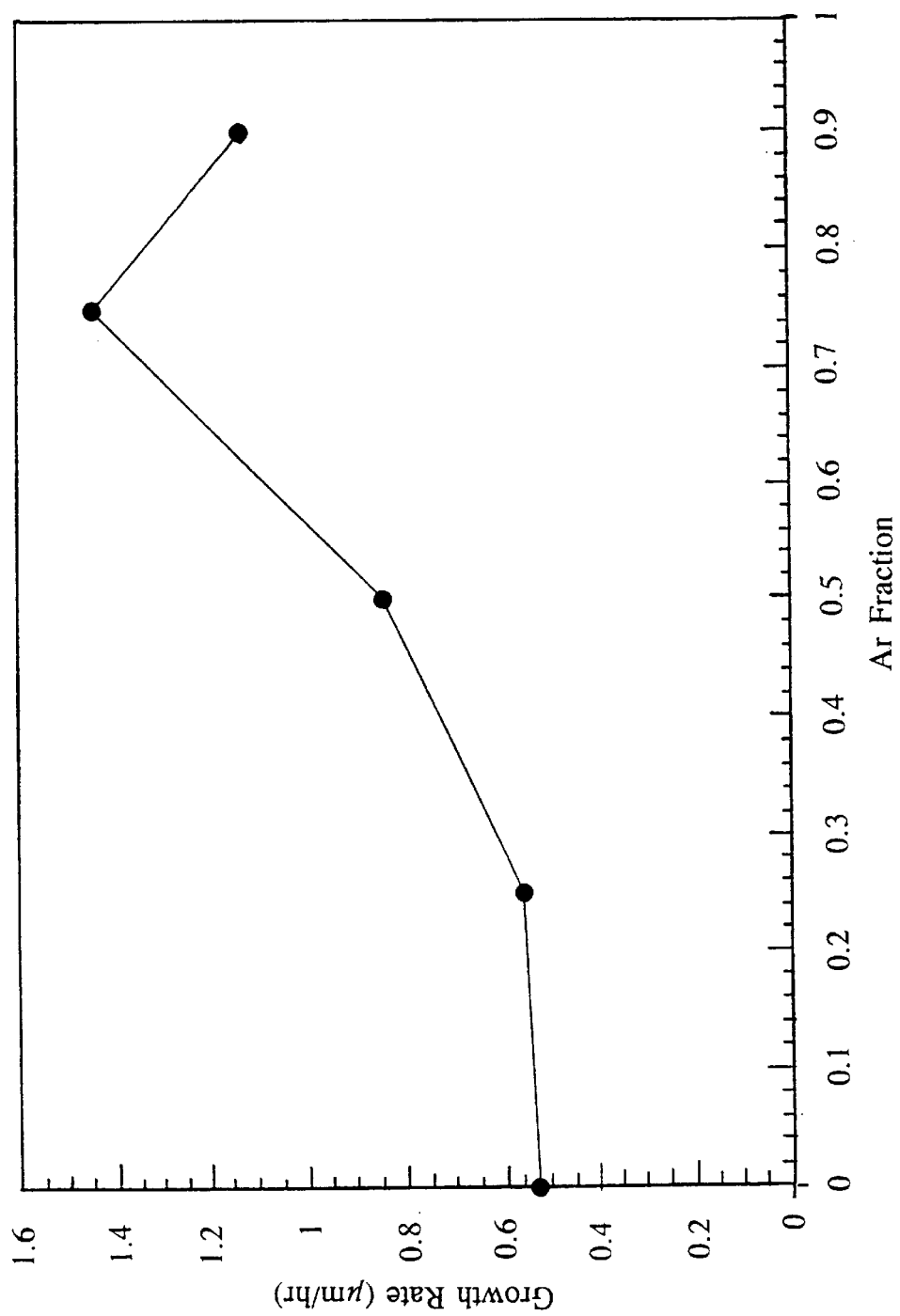
FIG. 13 shows growth rate in an Ar/$H_2$/$CH_4$ plasma as determined by laser interferometry. The gas mixture contained 1% $CH_4$ and the Ar/$H_2$ ratio was varied. The x-axis of FIG. 13 is [Ar]/[Ar+$CH_4$+$H_2$]. The growth rate increases with increasing argon fraction to a peak value near a fraction of 0.75; the growth rate increases by nearly a factor of three over the argon-free condition.

The fraction of Ar in the reactor was varied to determine the effect on growth rate and plasma emission for the five conditions shown in Table 3. The total flow of gas to the reactor was kept constant with increasing amounts of argon substituted for hydrogen. For each condition, the gas flow was set and the emission spectrum measured after the growth ratio equilibrated. The growth rate is observed to increase with increasing argon fraction to a peak value for an argon fraction near 0.75 (data condition 4) as shown in FIG. 13. The argon addition leads to growth rates of up to a factor of three greater than that of hydrogen-methane. The change in gas composition has a large effect on the gas phase chemistry, as evidenced by the emission spectrum.

TABLE 3

Power: 1500 W
Pressure: 80 Torr
Temperature: 850° C.

| Data Point | $H_2$ Flow (sccm) | Ar Flow (sccm) | $CH_4$ Flow (sccm) |
|---|---|---|---|
| 1 | 100 | 0 | 2 |
| 2 | 75 | 25 | 2 |
| 3 | 50 | 50 | 2 |
| 4 | 25 | 75 | 2 |
| 5 | 10 | 90 | 2 |

Figure 14:
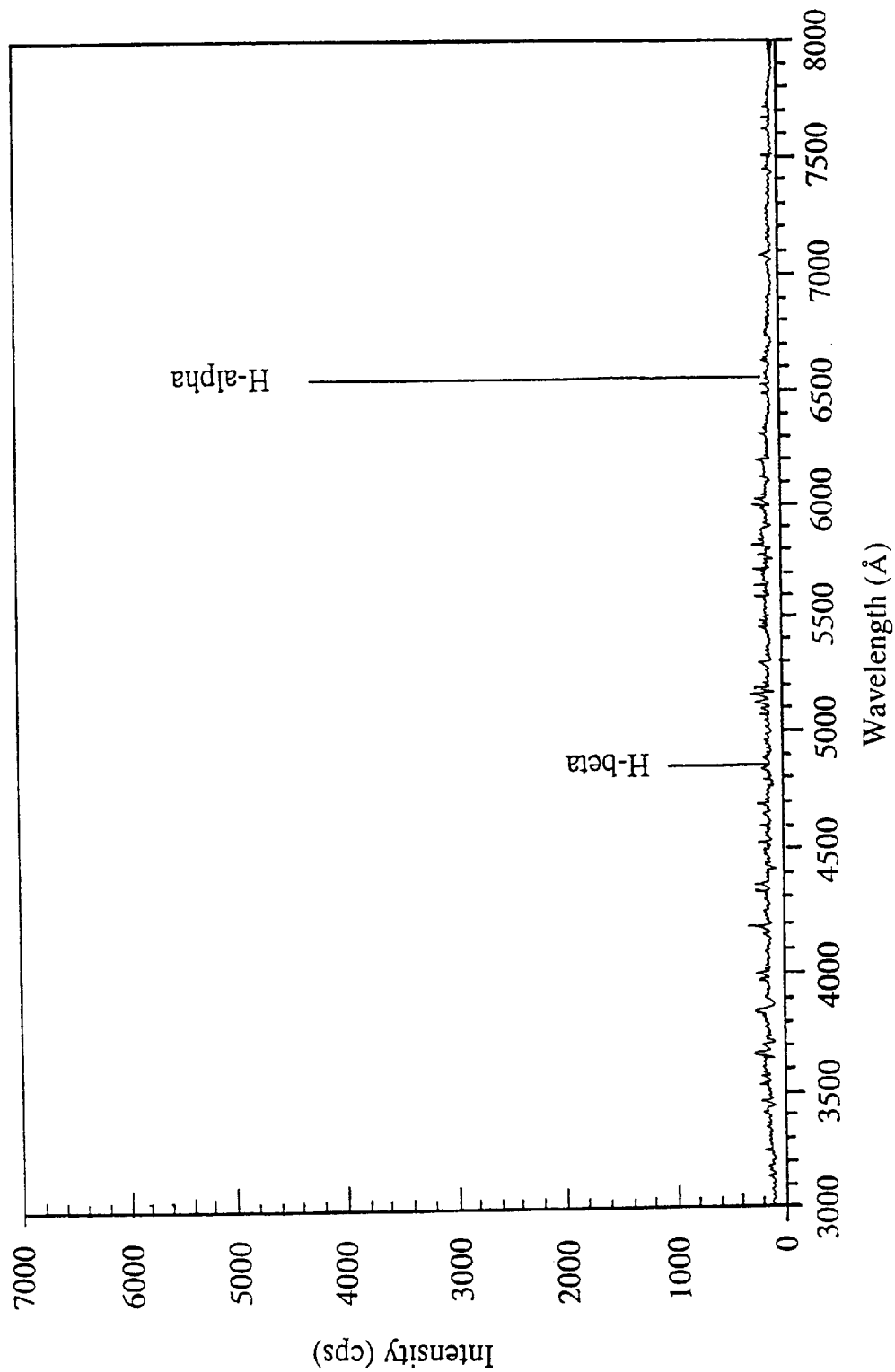
FIG. 14 shows an emission spectrum from a 100 sccm $H_2$ and 2 sccm $CH_4$ plasma; only H-alpha and H-beta emission lines from atomic hydrogen are observed.
Figure 15:
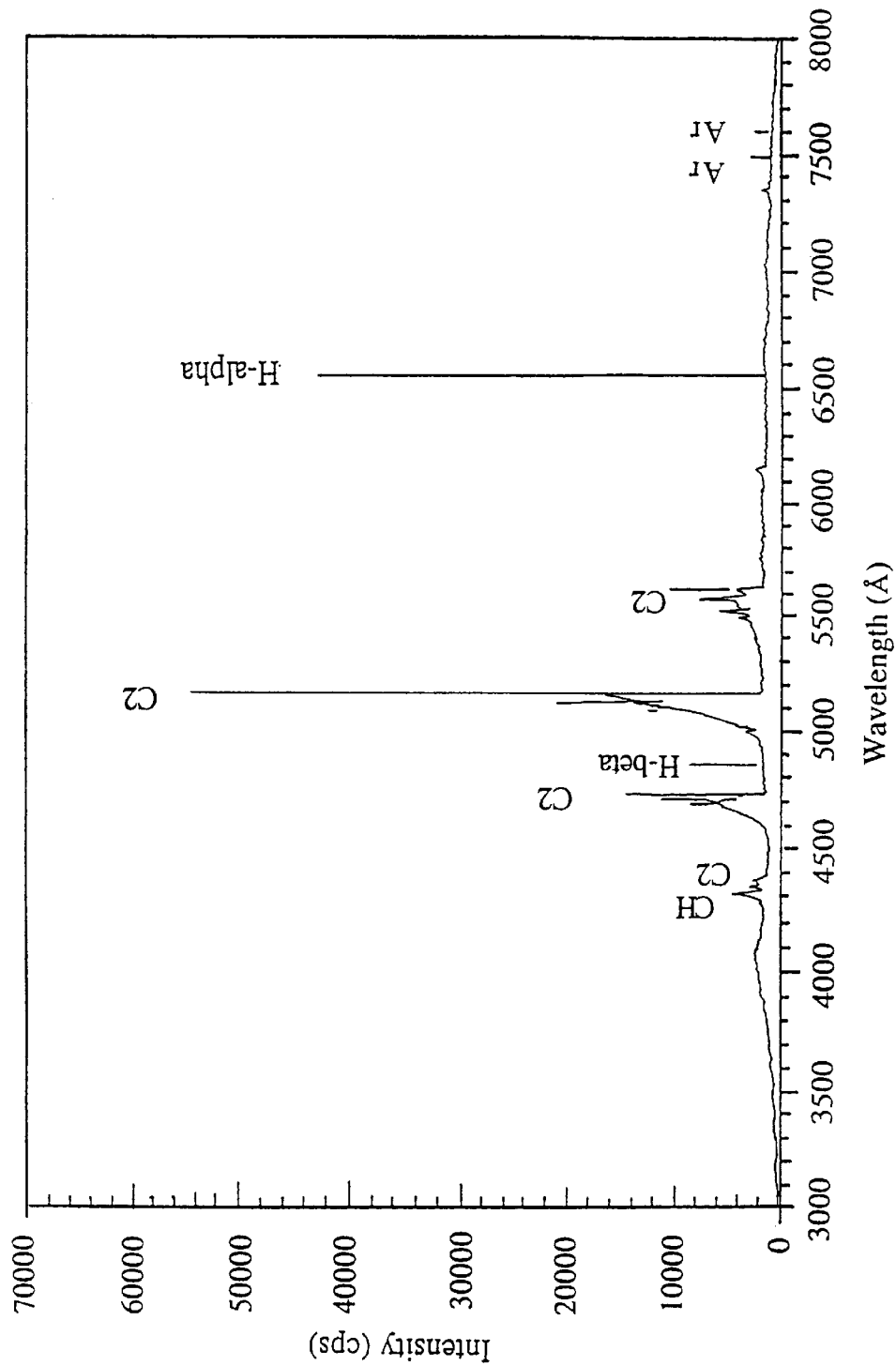
FIG. 15 shows an emission spectrum from 25 sccm $H_2$, 75 sccm Ar and 2 sccm $CH_4$ plasma; the $C_2$ Swan bands and atomic hydrogen lines are prominent, while the CH band at 4310 Å and atomic argon lines at 7504 Å and 7635 Å are distinguishable.
Figure 16:
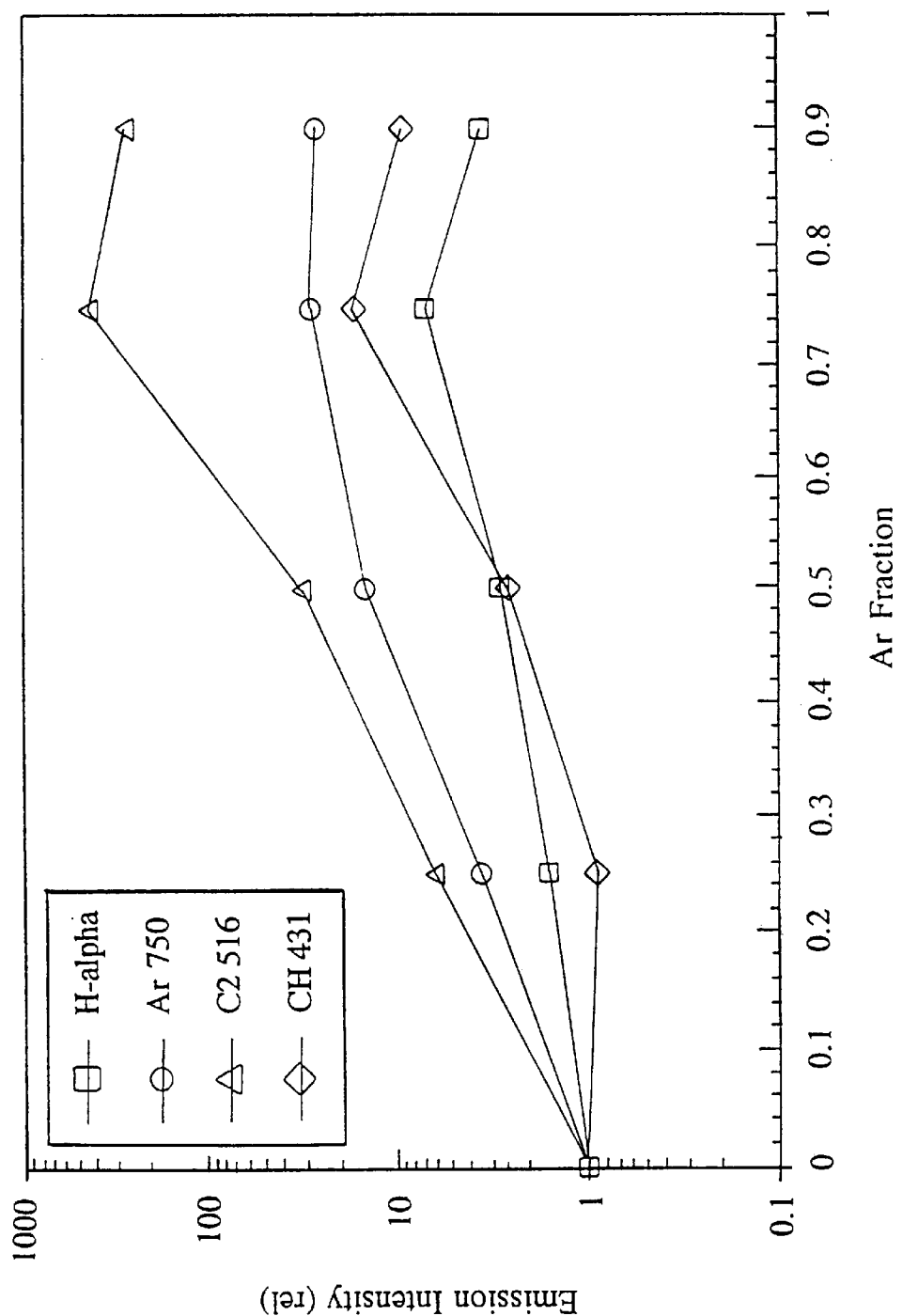
FIG. 16 shows emission intensities from H (6560 Å), Ar (7504 Å), $C_2$ (5160 Å band), and CH (4310 Å band) plotted as a function of Ar fraction; $C_2$ emission increases by the greatest amount and increases in intensity relative to other emitting species, indicating an increase in gas phase concentration as the Ar flow increases.

Emission spectra for data condition 1 (100 sccm $H_2$, 2 sccm $CH_4$) and condition 4 (25 sccm $H_2$, 75 sccm Ar, 2 sccm $CH_4$) are shown in FIGS. 14 and 15. For condition 1, the atomic hydrogen lines are very prominent with little emission from other species. By contrast, the high Ar fraction for condition 4 results in prominent emission bands, particularly from $C_2$. Emission from CH, as well as lines from Ar and H, are also evident. The intensities of H-alpha (6560 Å), Ar (7504 Å), $C_2$ (5160 Å band) and CH (4310 Å band) are plotted as a function of Ar fraction in FIG. 16. The intensities were normalized to values of unity for condition 1. $C_2$ emission increases by as much as a factor of 500, and by an order of magnitude relative to other emitting species, reflecting (as mentioned earlier) an increase in the gas phase concentration of $C_2$. It is interesting to note that the $C_2$ emission intensity drops when the argon fraction was increased from 0.75 to 0.90, and the growth rate also decreased. This reproducible phenomenon is currently being investigated by us in detail.

In a second experiment, $H_2$ and Ar flows were maintained at 50 sccm while the $CH_4$ flow was varied from 1 to 5 sccm. Measurements of growth rate and plasma emission were made for seven conditions shown in Table 4. Again, for each condition the gas flow was set, and the emission spectrum was measured after the growth rate equilibrated.

TABLE 4

Power: 1500 W
Pressure: 100 Torr
Temperature: 850° C.

| Point | $H_2$ Flow (sccm) | Ar Flow (sccm) | $CH_4$ Flow (sccm) |
|---|---|---|---|
| 1 | 50 | 50 | 1 |
| 2 | 50 | 50 | 1.5 |
| 3 | 50 | 50 | 2 |
| 4 | 50 | 50 | 2.5 |
| 5 | 50 | 50 | 3 |
| 6 | 50 | 50 | 4 |
| 7 | 50 | 50 | 5 |

Figure 17:
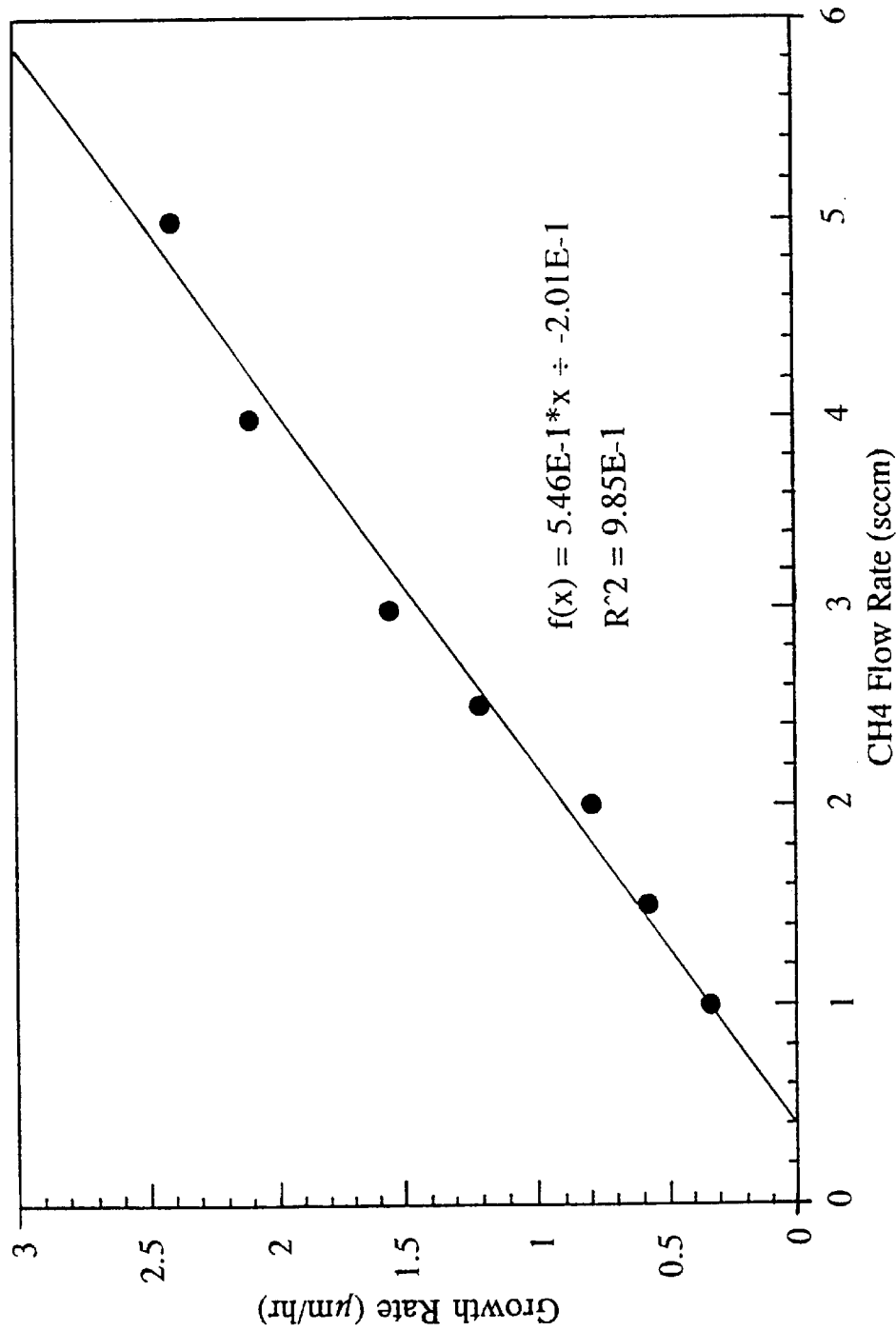
FIG. 17 shows the growth rate as determined by laser interferometry. The rate increases linearly with $CH_4$ flow.
Figure 18:
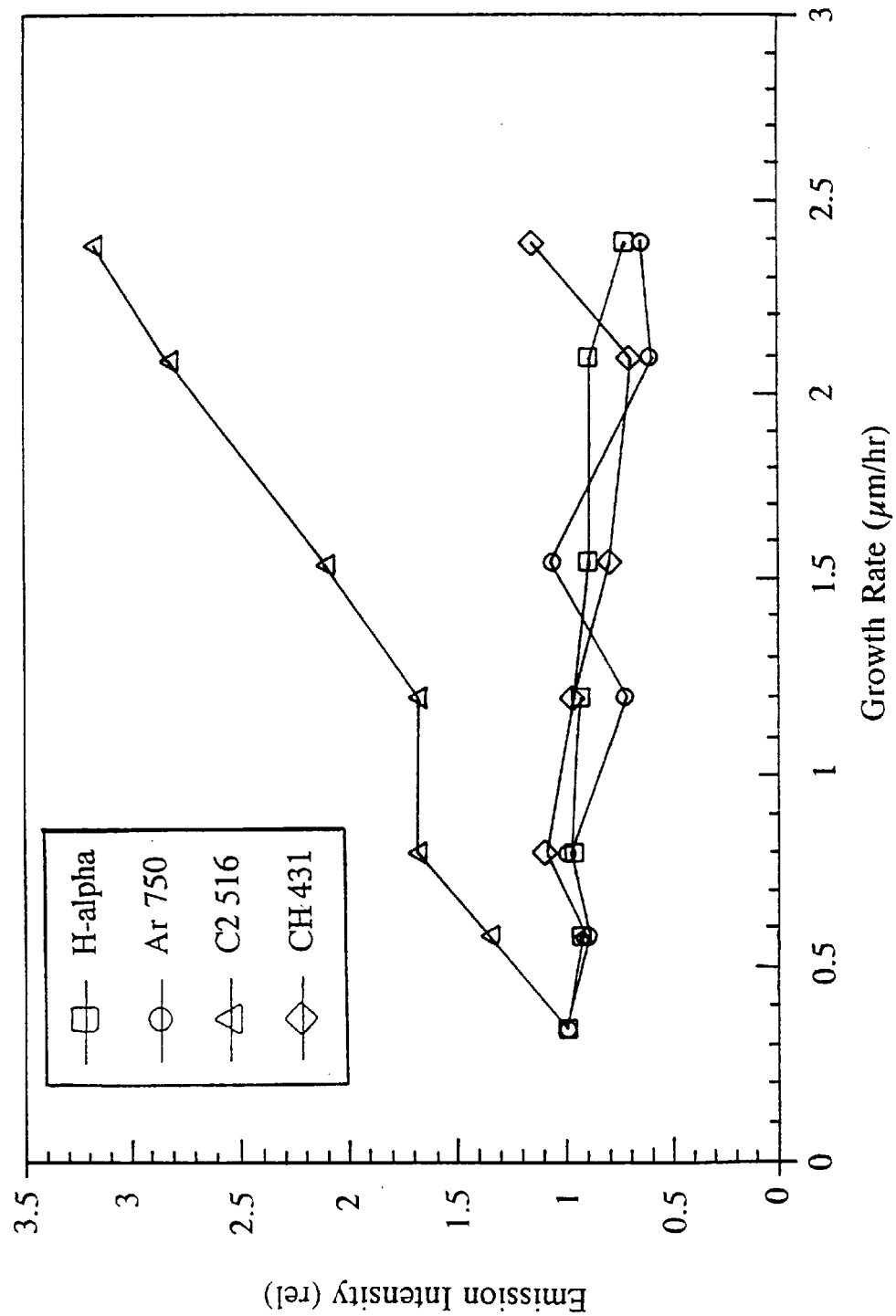
FIG. 18 shows plasma Emission intensities observed as a function of growth rate for a second experiment; the $C_2$ emission increases linearly with growth rate, while emission from other species is nearly constant, identifying $C_2$ as the growth species.

In this set of experiments, the growth rate increased linearly with increasing $CH_4$ flow as shown in FIG. 17. The changes in $CH_4$ flow result in small changes in the gas composition and can be thought of as a perturbation to the plasma. Since excitation and quenching rates can be expected to change only marginally under these conditions the emission intensity is likely correlated with ground state species concentrations in the plasma. The emission intensities of H, Ar, $C_2$ and CH are plotted as a function of growth rate in FIG. 18, normalized to unity at condition 1. The growth rate is unrelated to the $H_2$, Ar and CH emission intensities, but increases linearly with $C_2$ emission intensity. Thus, we conclude that the growth rate depends on the $C_2$ gas phase concentration in the plasma.

Figure 19:
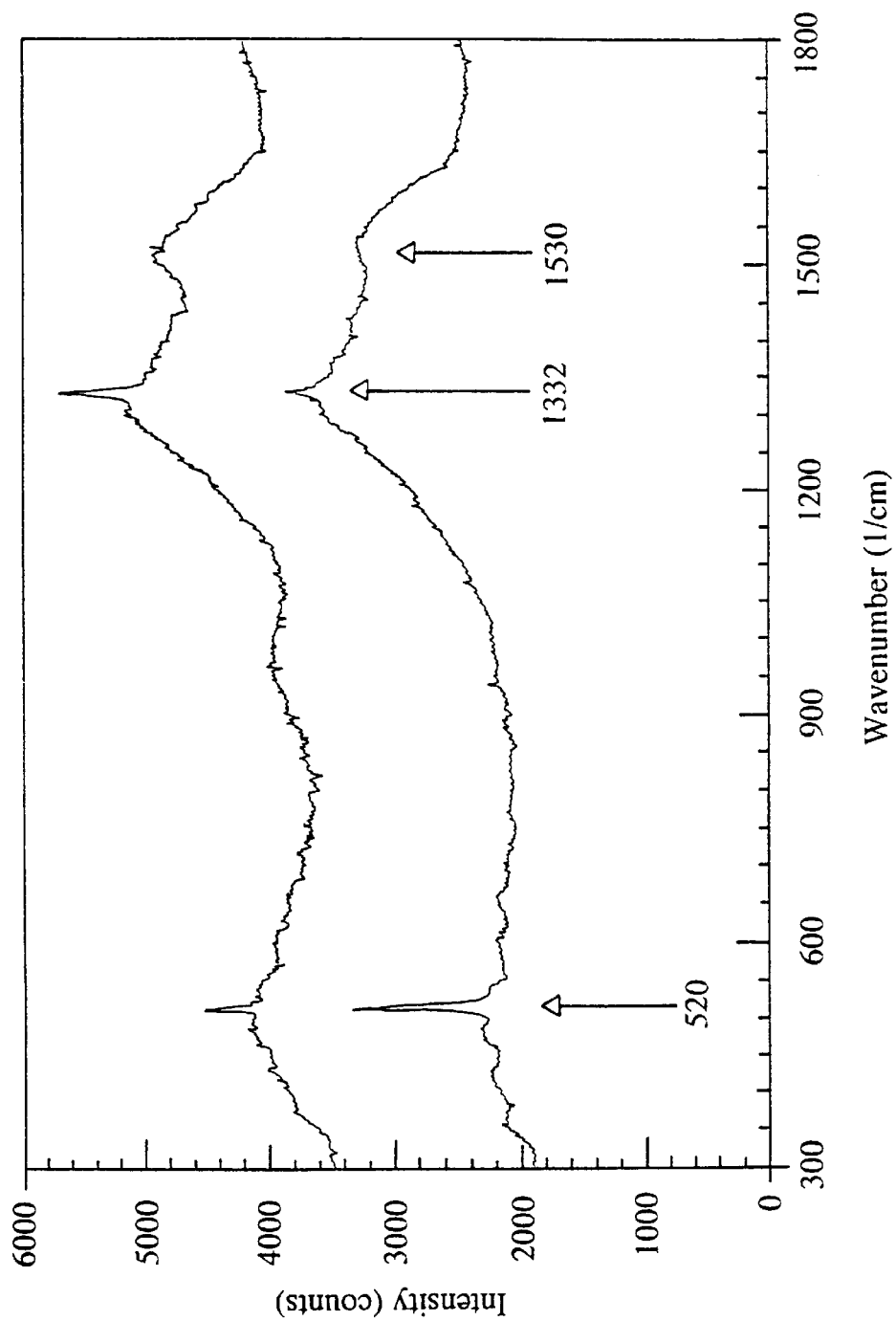
FIG. 19 shows Raman spectra of the films produced in the two experiments; the lower spectrum is from the first experiment, where the Ar fraction in the reactor was varied; the upper spectrum is from the second experiment, where methane flow was increased.

Finally, Raman spectra for the two films grown in the above experiments are shown in FIG. 19 to confirm that diamond was indeed deposited. The lower spectrum is from the first film, where the Ar gas fraction was varied throughout the deposition. The film was 2.8 μm thick and the diamond peak at 1332 cm$^{-1}$ is clear. The broad features at 1530 cm$^{-1}$ and 1330 cm$^{-1}$ have been attributed to the presence of nondiamond carbon, but may also be an artifact of the very small grain size. The transparency of the film is evident from the silicon peak at 520 cm$^{-1}$, which results from light penetrating to the silicon substrate under the film. The upper spectrum is from the second film, grown under varying methane concentrations. This film was 4 μm thick. The diamond peak is more pronounced than in the first film, but the features otherwise appear similar. From this we conclude the films grown from $CH_4/H_2/Ar$ mixtures are predominantly diamond.

Additional support for this conclusion of the films being diamond comes from a measurement of the refractive index of the films. The above-described film thickness was measured to be 4.0±0.03 μm, while the reflectivity of the surface underwent 31.5 oscillations. The index of refraction is related to the film thickness and the number of oscillations by $$n = m\lambda/2d,$$

where λ is the laser wavelength (0.6328 μm), m is the number of oscillations in the reflectance (31.5) and d is the film thickness (4.0±0.3 μm). From this, the index of refraction of the film is calculated to be 2.5±0.2. This is within error of the accepted value of 2.41 for bulk diamond at this wavelength.

As previously discussed, $C_2$ deposition to form diamond is energetically favorable. Ab initio calculations indicate that $C_2$ insertion into the reconstructed hydrogen-terminated (100) surface of diamond is energetically favorable with small activation barriers. It has been experimentally determined that diamond films can, using this process, be grown at relatively low temperatures (<500° C.), as opposed to conventional diamond growth processes which require substrate temperatures of 800° C.–1000° C. These high substrate temperatures preclude deposition on many materials of technological importance.

Figure 20:
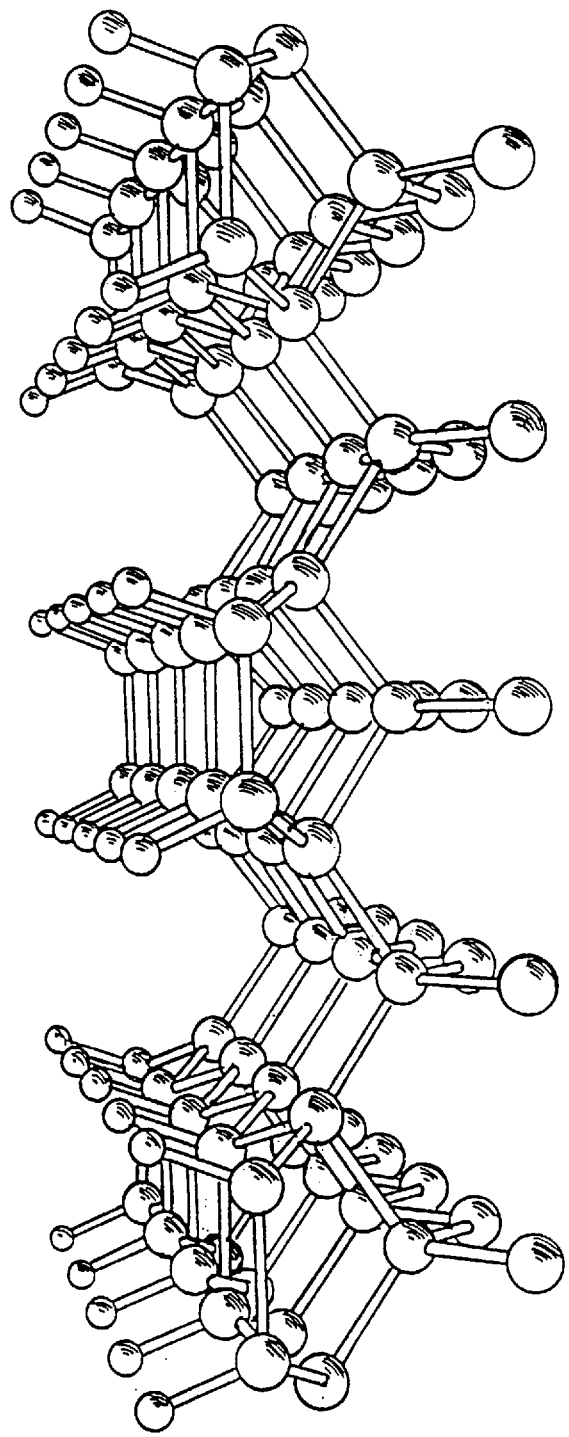
FIG. 20 shows a (100) (2×1):H reconstructed diamond surface.
Figure 21:
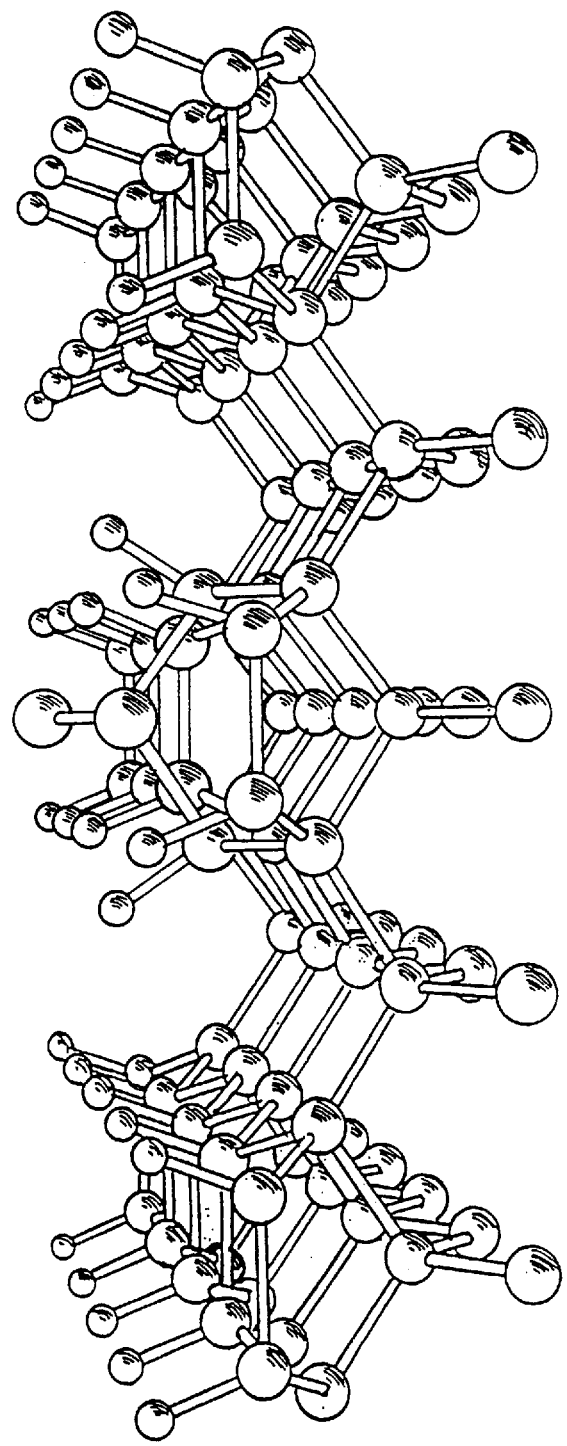
FIG. 21 shows a $C_2$ molecule inserted into a C—C surface dimer bond.
Figure 22:
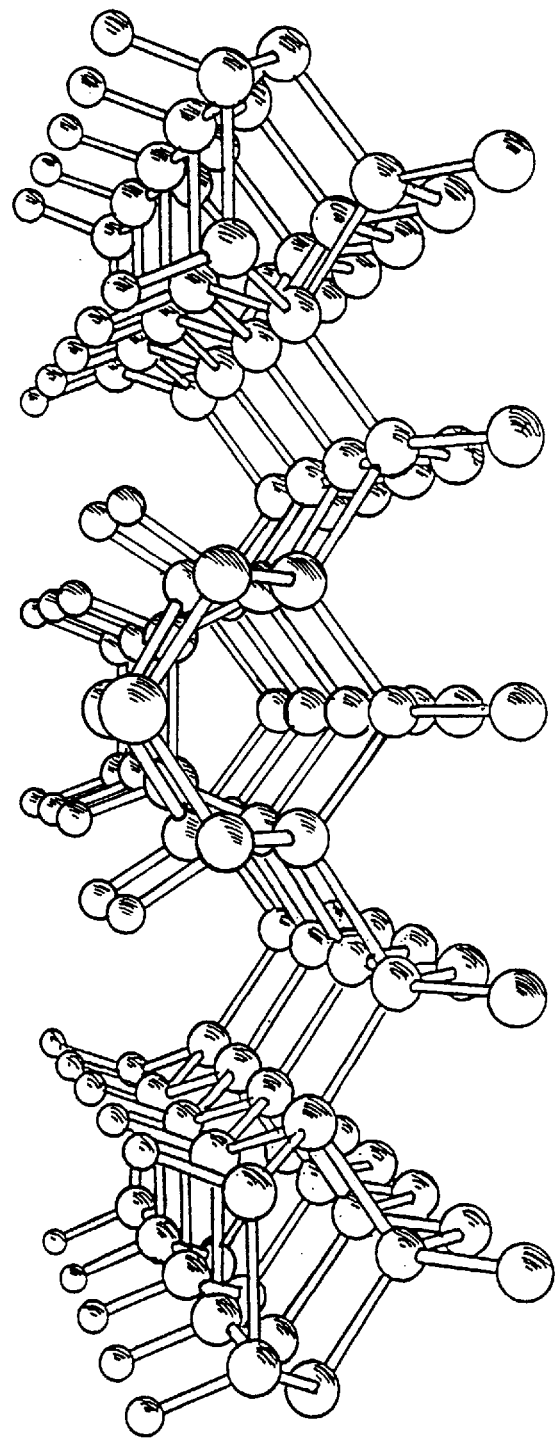
FIG. 22 shows a $C_2$ molecule inserted into an adjacent C—C surface dimer bond, forming a new surface dimer perpendicular to the previous dimer row.
Figure 23:
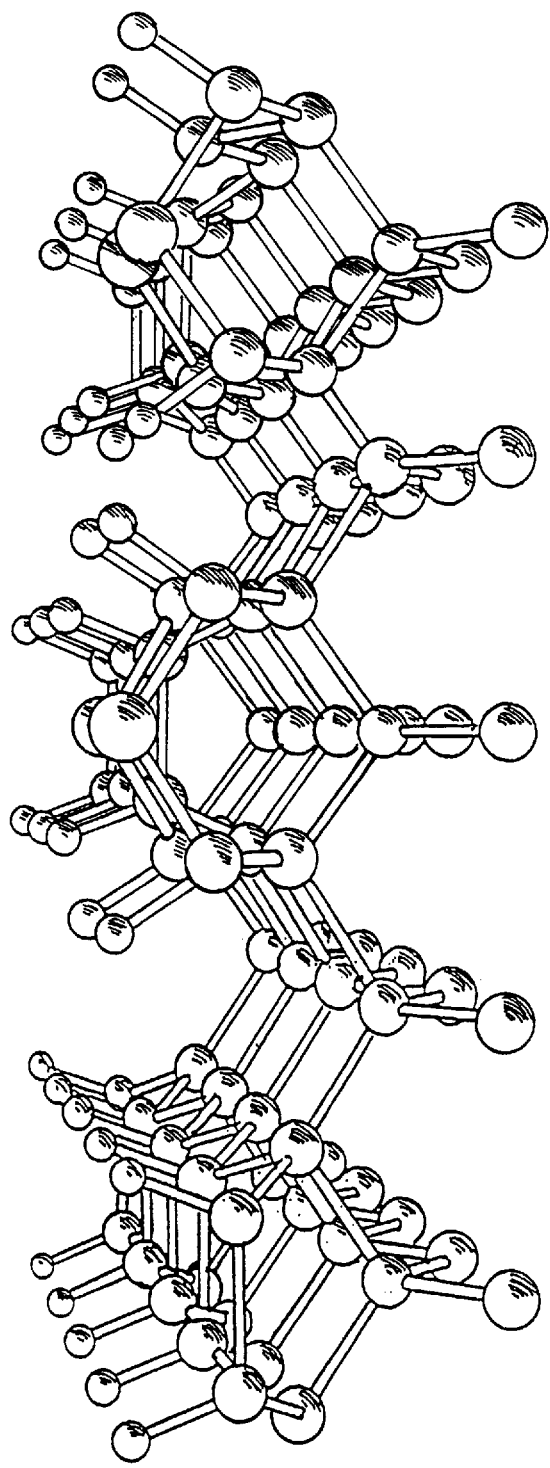
FIG. 23 shows a second $C_2$ molecule forming a new surface dimer in an adjacent dimer row.
Figure 24:
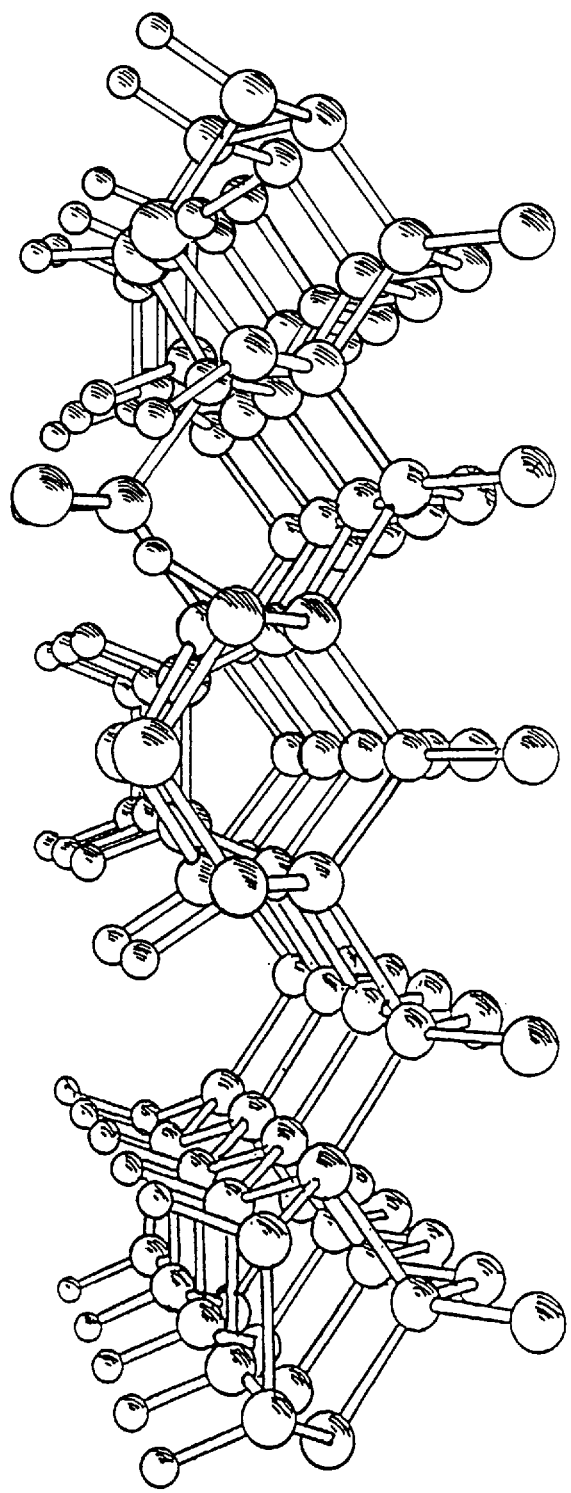
FIG. 24 shows a third $C_2$ molecule inserted into the trough between the two previously incorporated $C_2$ molecules.
Figure 25:
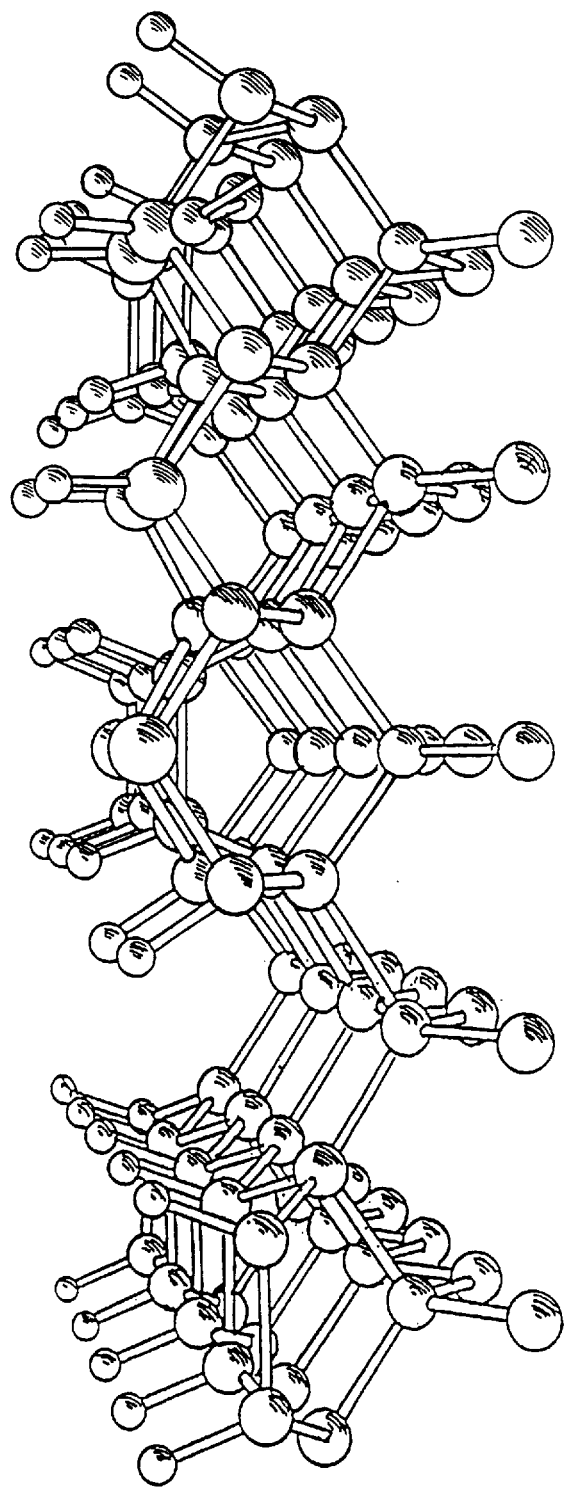
FIG. 25 shows the third $C_2$ molecule completing insertion into the trough, forming a dimer row perpendicular to the previous surface row.

Without limiting the scope of the invention, in FIGS. 20–25, a proposed mechanism for growth on the diamond (100) (2×1):H reconstructed surface with $C_2$ is outlined. FIG. 20 shows the (100) (2×1):H reconstructed diamond surface, thought to be the most likely surface in these environments. The large atoms are C and the small atoms are H terminating the surface. A $C_2$ molecule impinges on the surface and inserts into a surface C—C dimer bond, as shown in FIG. 21. The $C_2$ then inserts into an adjacent C—C bond to form a new surface carbon dimer, as shown in FIG. 22. By the same process, a second $C_2$ molecule forms a new surface dimer on an adjacent row, as shown in FIG. 23. A third $C_2$ molecule inserts into the trough between the two new surface dimers as shown in FIGS. 24 and 25. The three $C_2$ molecules incorporated into the diamond surface form a new surface dimer row running perpendicular to the previous dimer row. The $C_2$ growth mechanism as proposed here requires no hydrogen abstraction reactions from the surface and in principle should proceed in the absence of gas phase atomic hydrogen.

In another aspect of the invention, the previously described methods of manufacture can be applied to produce equiaxed nanocrystalline diamond film and fine grained dendritic structures. Such preferred structures are advantageous for specialized applications calling for very uniform, fine grained diamond which is quite smooth and can be reliably produced as layers of extremely small thickness. For example, diamond layers can be used to great advantage on field emission microtips (or any such electronic or optical application) which require deposition of a very thin, smooth conformal diamond coating which preserves the topographical features of the substrate. Diamond has been shown to be a cold cathode electron emitting material with emission characteristics which follow the known Fowler-Nordheim relation corresponding to field-induced electron tunneling. A variety of requirements, however, should be met for electron emission applications: the material must (1) have the low work function/negative electron affinity of diamond, (2) have sufficient electrical conductivity to provide a conducting path to the substrate in order to restore the emitted electrons to the surface, (3) for planar emitters, the film should have a surface topography which enhances the electric field at the surface and (4) for microtip arrays, the film should have a morphology which produces a uniform thin coating on microtips which have contour requirements on the 10–100 nm scale.

Figure 26:
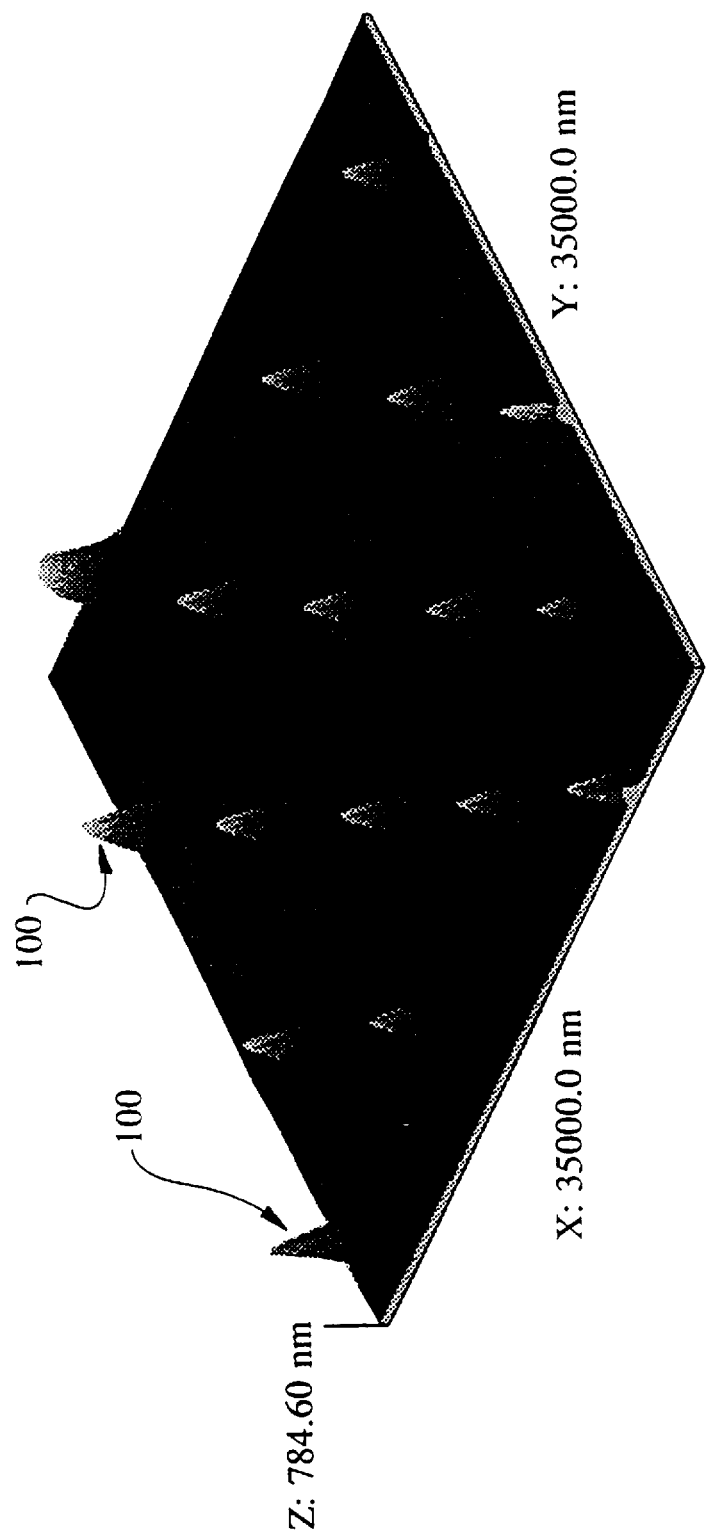
FIG. 26 shows an atomic force micrograph of an array of typical field emission tips.
Figure 27A:
FIG. 27A shows a scanning electron microscope image of a diamond film grown in a $H_2$/$CH_4$ plasma.
Figure 28A:
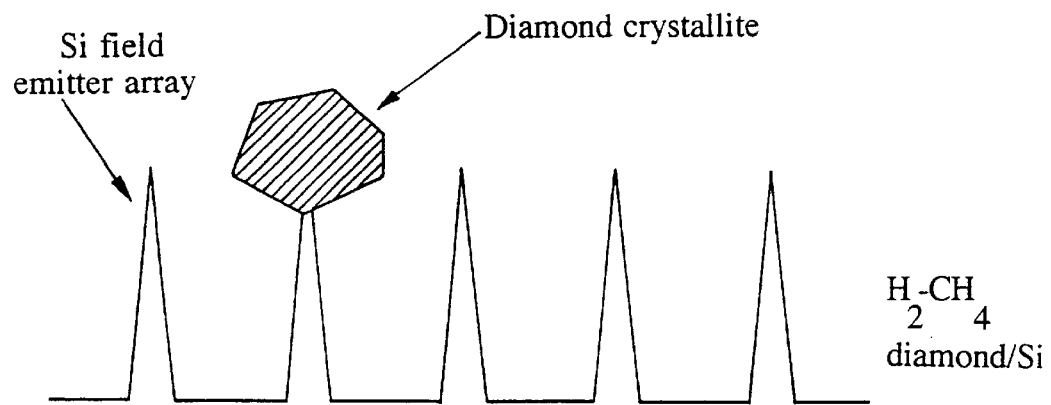
FIG. 28A shows a schematic illustration of field emission tips and a diamond crystallite deposited on one of the tips using an $H_2$—$CH_4$ plasma and FIG. 28B shows a schematic illustration of field emission tips covered with a layer of nanocrystalline diamond formed from a plasma of a noble gas and $C_{60}$ or $CH_4$, $C_2H_2$ or anthracene.
Figure 28B:
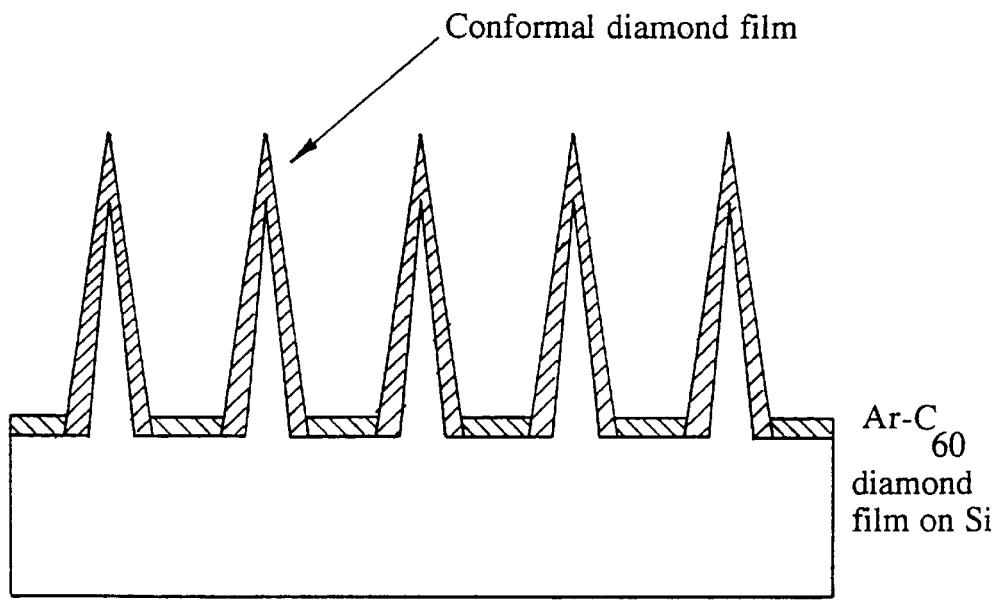

Microtip arrays typically are very well defined tips 100 as shown in FIGS. 26 and 28. These tips 100 are typically made of silicon using photolithography techniques developed by the semiconductor industry and have submicron size dimensions. Conventional diamond layer deposition techniques produce the morphology of diamond crystals 102 shown in FIG. 27A and FIG. 28A. Such structures would not enable use of diamond coated microtips as field emitters. The capability of producing very thin diamond films which are continuous and uniform in thickness is demonstrated by FIG. 9. This figure is a cross-section TEM which shows a 20–30 nm thick film which has a continuity and density unattainable by conventional diamond growth processes.

Figure 27B:
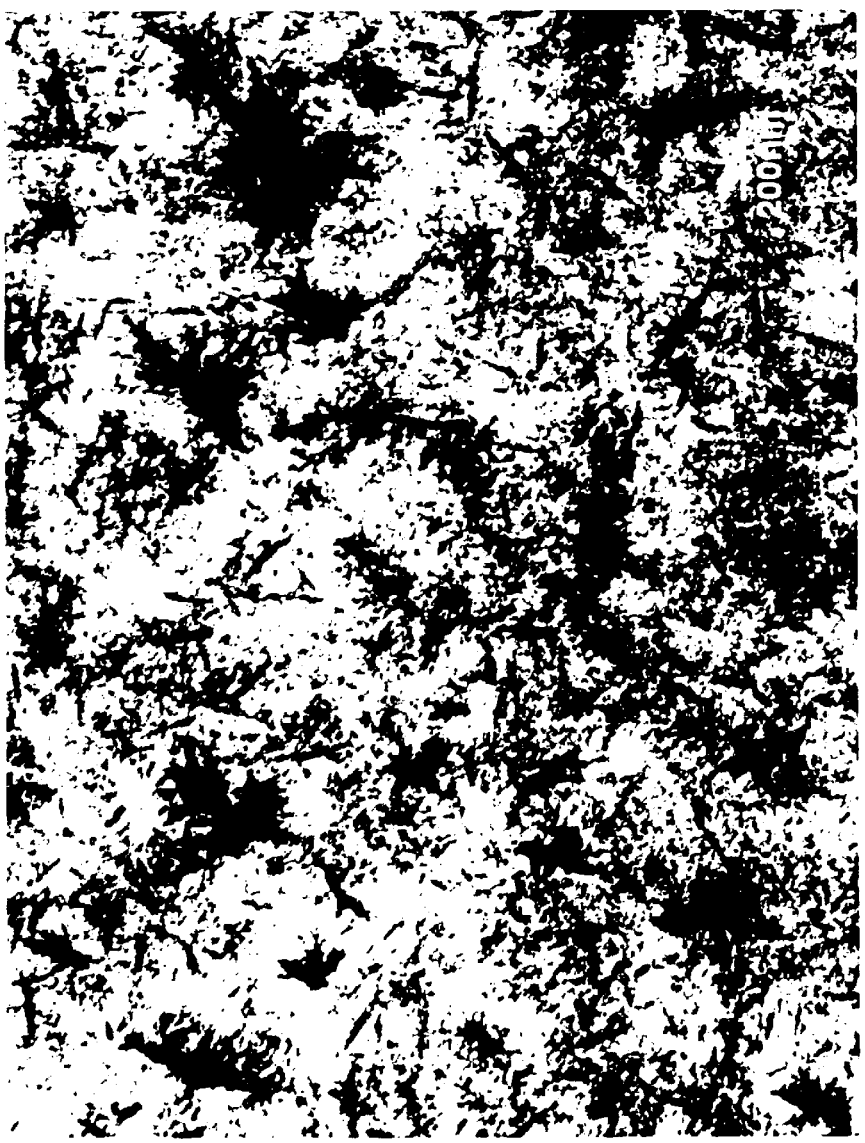
FIG. 27B shows a transmission electron microscope image of a diamond layer prepared from a plasma of $CH_4$/Ar.
Figure 27C:
FIG. 27C shows a transmission electron microscope image of a diamond layer prepared from a plasma of Ar/$C_{60}$.
Figure 27D:
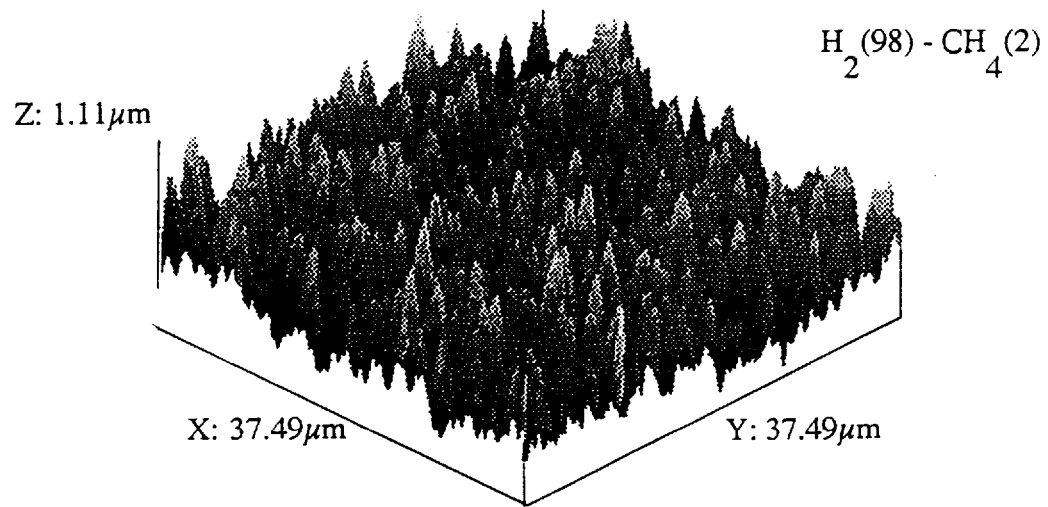
FIG. 27D shows Atomic Force micrographs of diamond films grown from an $H_2$—$CH_4$ plasma (upper figure) and from an Ar—$C_{60}$ plasma with very low (2%) hydrogen concentration. The vertical scales are the same, illustrating a pronounced difference in surface roughness for the two processes.
Figure 27D:
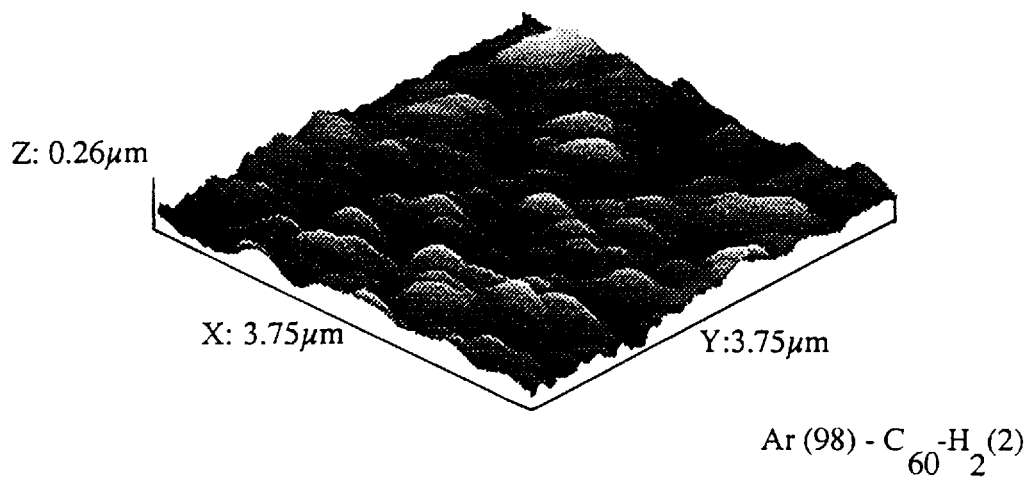

As shown in FIG. 27C, a highly equiaxed, nanocrystalline diamond film (average grain size of 15 nm and range of 10–30 nm) can be deposited using one of the methods described herein (see Examples I and VIII). Moreover, as noted in Example V, there is no evidence of graphite formation which further enhances the suitability of the diamond film to a variety of electronic applications.

In another variation of the method as described in Example VII, $CH_4$ and $C_2H_2$ were used as the source of carbon in combination with an inert gas and a small amount of $H_2$. For these combinations of conditions very smooth, uniform nanocrystalline diamond film (see Example VIII) is also obtained, but has a somewhat irregular, dendritic morphology as shown in FIG. 27B. Again, there was no evidence of graphite formation.

As set forth in Example IX, the electronic properties of the above-described diamond layers are well suited for use as field emission tips and other demanding electronic applications.

The following nonlimiting examples set forth exemplary embodiments of the inventions:

EXAMPLE I

A $C_{60}$ sublimation source was coupled to a microwave chamber operated with a microwave generator at 2.45 GHz as shown in FIG. 1. The system as a whole is an ASTeX PDS-17 unit supplied by Applied Science and Technology. Fullerene containing soot was made in a conventional manner or was obtained from MER Corporation. (e.g., about 10% $C_{60}$ in the soot). The soot was treated with methanol to remove most of the hydrocarbon constituents. The cleaned soot was place in a gold container which in turn was disposed in a quartz tube wound with nichrome wire used to heat the soot. The microwave chamber was evacuated and the soot heated to about 200° C.–250° C. for two hours to remove residual methanol solvent, hydrocarbons and absorbed gases. The rate of $C_{60}$ sublimation was determined by placing a silicon wafer in front of the outlet of the sublimation source inside the microwave chamber. An argon gas flow of 20 sccm with a total pressure in the chamber of 100 Torr was established by use of a carrier gas inlet into the sublimation source. The sublimation source was maintained at about 500° C., and adequate $C_{60}$ was deposited in one-half an hour on the silicon single crystal (maintained at temperatures above about 470° C. so that a typical $C_{60}$ infrared absorption spectrum could be easily noted. Raman spectroscopy confirmed the presence of $C_{60}$. There were no features in the infrared spectrum that could be attributed to species other than $C_{60}$.

EXAMPLE II

The same manufacturing procedure set forth in Example I was followed except the silicon wafer was removed, and fresh soot was placed in the sublimation source. The temperature of the sublimation source was raised to about 500° C., the microwave generator was activated and a 500 watt microwave discharge was initiated at 1 Torr argon. A quartz fiber optic cable was coupled to the microwave chamber to enable viewing of the plasma discharge at a region about 1–1.5 cm above the silicon substrate. The light within the fiber optic cable was transmitted to an Interactive Technology model 103 optical monochromator with 200 micron entrance and exit slit widths. The monochromator wavelength was stepped in increments of about 2.3 Angstroms with a dwell time of about 100 msec/step. The light detector was a Peltier cooled photomultiplier tube operating in a pulse counting mode with a dark count rate of 20–30 cps. A Macintosh IIci control computer was used with software to provide a 100 msec gating pulse to the 32-bit National Instruments counter board located in the computer back plane.

Figure 3A:
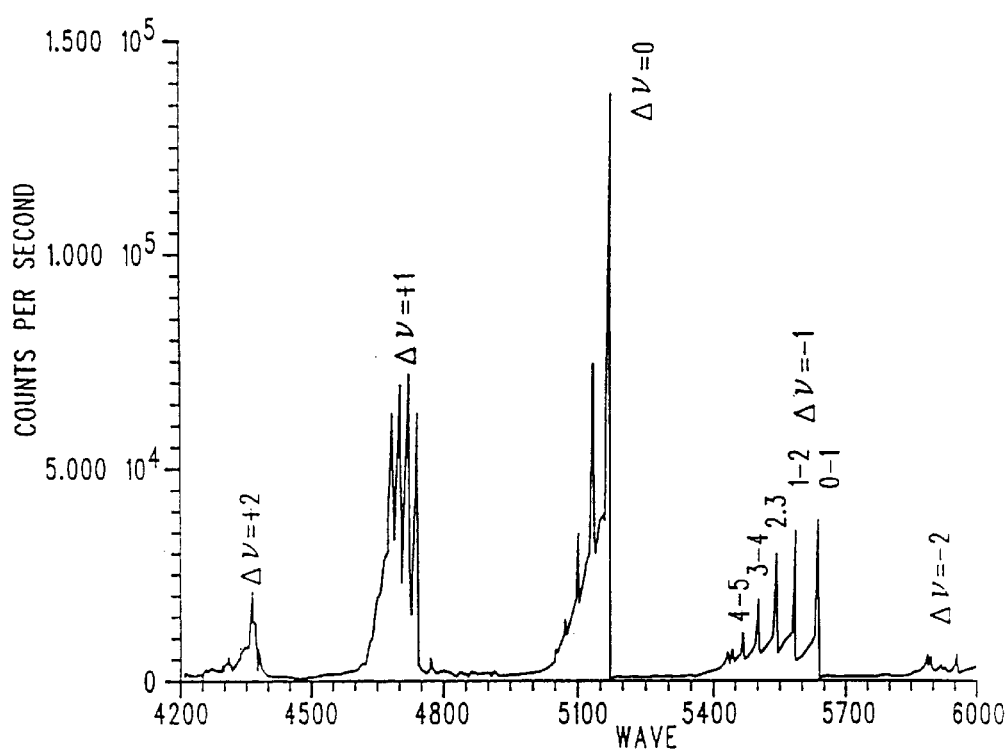
FIG. 3A illustrates an emission spectrum for a plasma in the system of the invention.
Figure 3B:
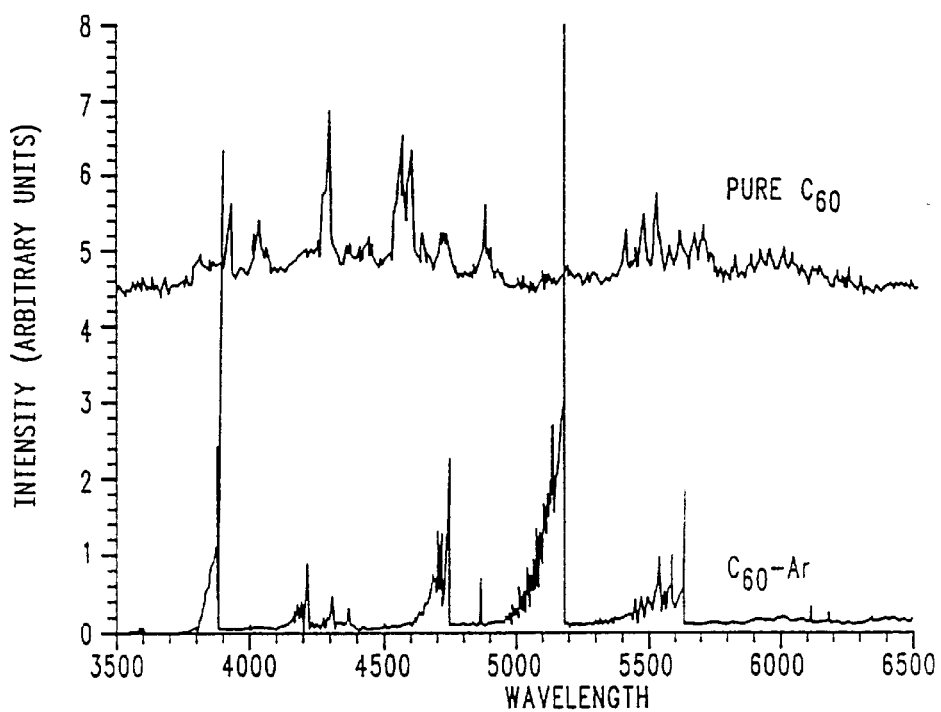
FIG. 3B compares the plot of FIG. 3A to the spectrum for a plasma without a noble carrier gas present (top plot)

A typical spectrum obtained from the intensely emerald green plasma discharge is shown in FIG. 3A. The spectrum is dominated by the $d^3$ $\Pi g$-$a^3$ $\Pi\mu$ Swan bands of $C_2$, particularly the $\Delta v$=–2,–1,0,+1,+2 sequences. This can be compared to the spectral output in the absence of a noble carrier gas as shown in FIG. 3B which does not exhibit $C_2$ bands.

It should also be noted that intense emissions are also observed characteristic of excited argon atoms in the 6000–8000 Angstrom range in FIG. 3A. Argon neutrals in such metastable states as $^3P_2$ at 11.55 eV can lead to efficient energy transfer to the $C_{60}$ molecules and consequent fragmentation.

EXAMPLE III

Figure 3C:
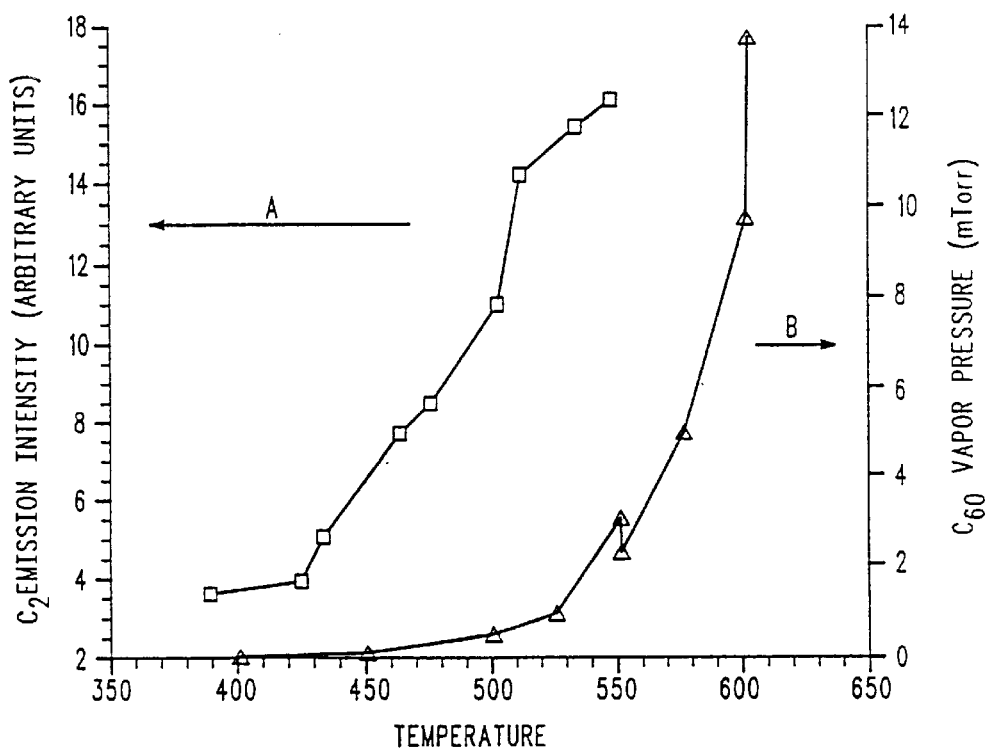
FIG. 3C shows $C_{60}$ vapor pressure and integrated intensity of the $\Delta$ v=o band from $C_2$ emissions.

An examination of the Swan bands in FIG. 3A was performed by analyzing emission spectra as a function of sublimator source temperature. The Swan band emission intensities were found to increase as a function of sublimator temperature (see FIG. 3C). Under saturation conditions of the argon carrier gas, the emission intensities should follow the vapor pressure of $C_{60}$ (see FIG. 3C, curve B). However, a log plot clearly shows that the argon carrier gas is far from being saturated with the equilibrium $C_{60}$ pressure. The $C_2$ concentration in the plasma increases with temperature due to increased $C_{60}$ volatility which shows the $C_2$ emission is not a minor constituent, nor is it due to carbon particles transported into the plasma. Continuation of this method of manufacture for a period of time (several hours or more) at sublimator temperatures of 550° C. results in depletion of $C_{60}$ and higher fullerenes, as evidenced by decreasing Swan band intensities in the spectra. After such a prolonged time of operation, lowering the temperature to 500° C. results in emission spectra having intensities diminished by a factor of ten compared to those obtained with a fresh batch of soot at 500° C.

EXAMPLE IV

The same basic method of Example II was followed except the microwave power level was varied from 500 to 1200 watts. There was no noticeable change in the absolute intensity or the intensity ratios of the different Swan band frequencies.

EXAMPLE V

Figure 6A:
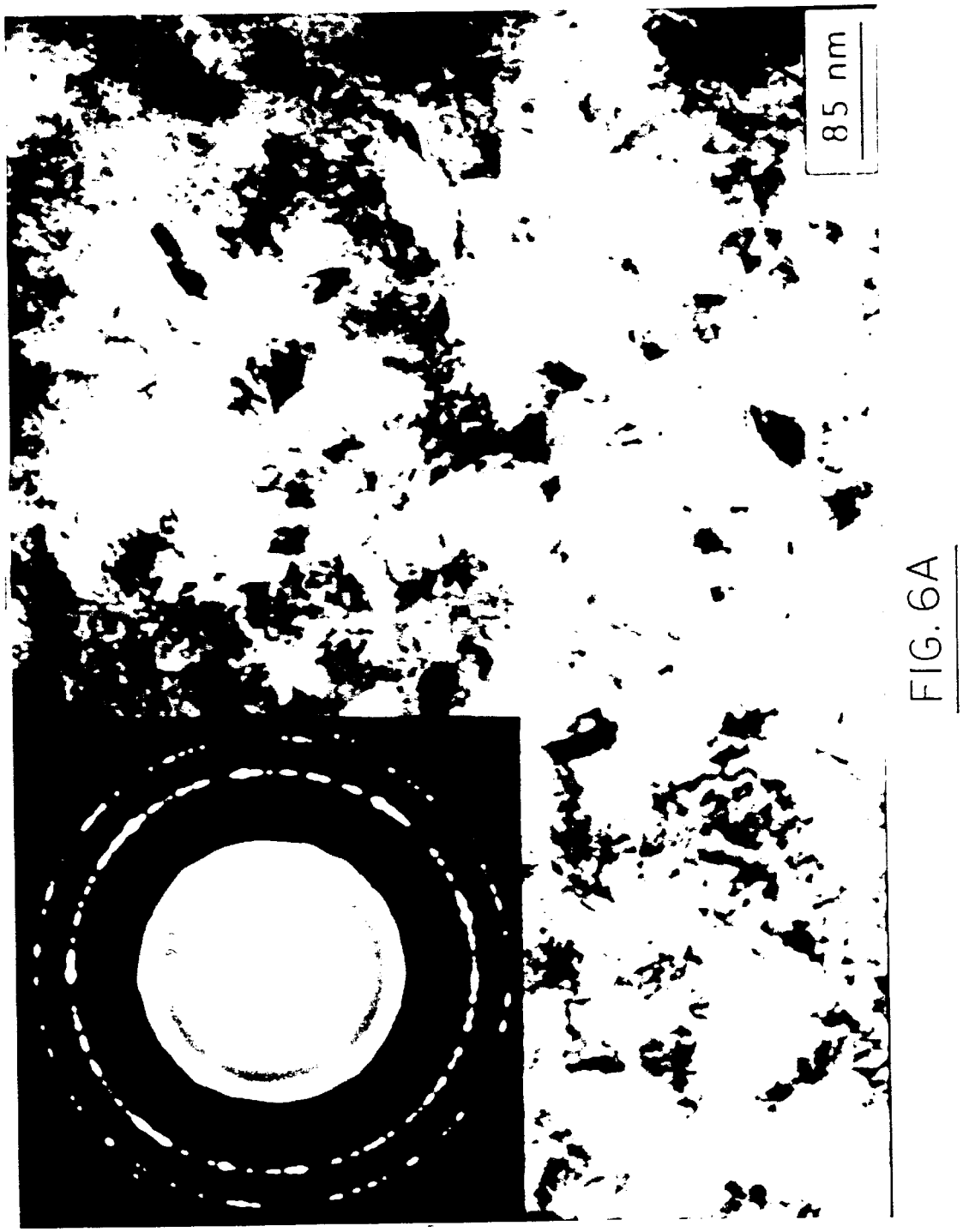
FIG. 6A illustrates a transmission electron microscope (TEM) micrograph from a diamond film of one form of the invention with a selected area electron diffraction pattern inset.
Figure 6B:
FIG. 6B illustrates a TEM micrograph of two diamond grains from a diamond film of the invention with the grains having a common <111> orientation.
Figure 29:
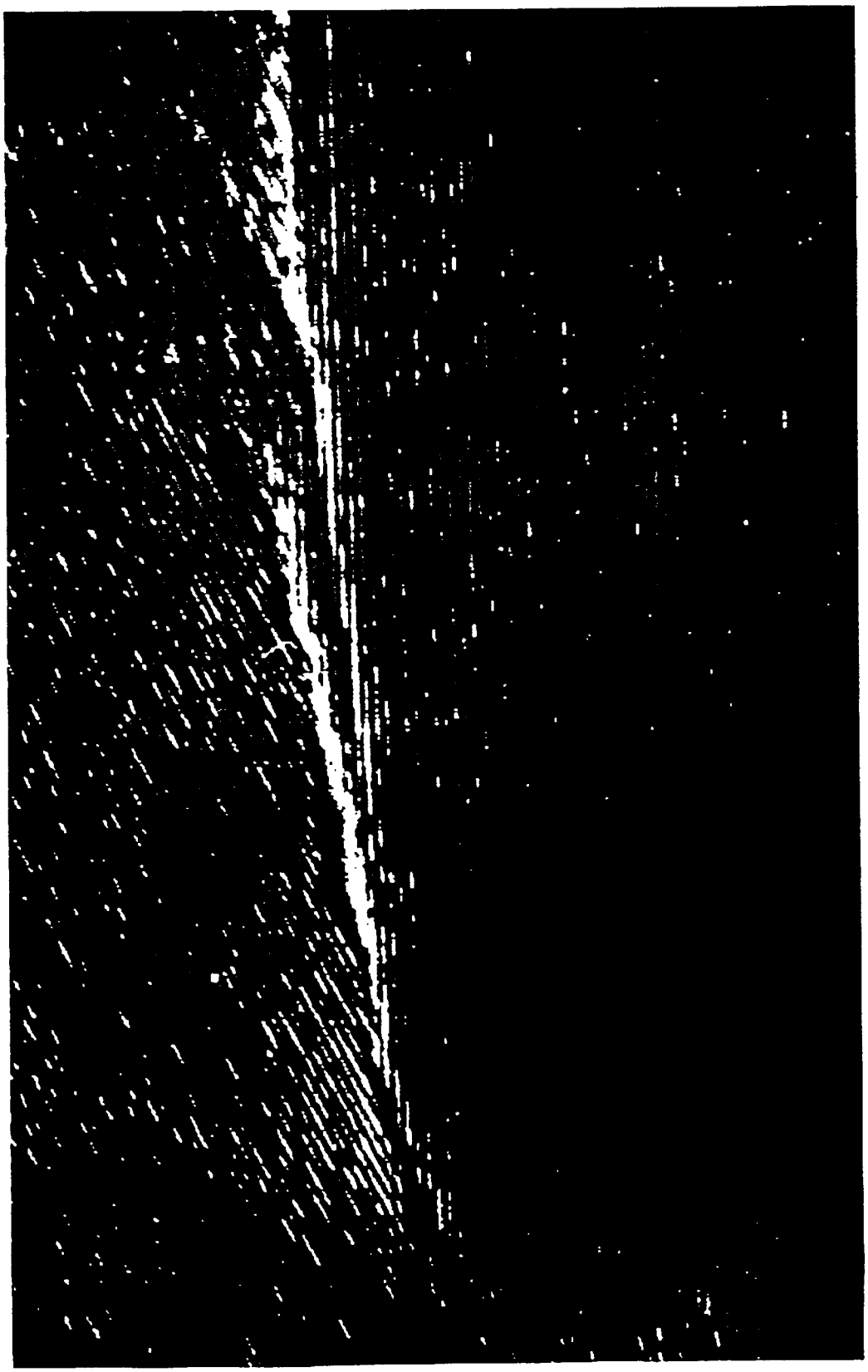
FIG. 29 is an atomic resolution TEM, of a diamond film grown in an Ar—$C_{60}$ plasma, showing atomically abrupt grain boundaries with no nondiamond intergranular material.

The growth rate of diamond film in Example II was characterized to be about 1.2 microns/hour which is comparable to or higher than the deposition rate obtained with a conventional plasma containing 1% methane in hydrogen. Conventional diamond films grown at this rate have a very large grain size, rough surface and high defect density. By lowering the pressure to ~300 mTorr and confining the plasma with a magnetic field, it is possible to reduce the defect density, grain size and surface roughness, but there is a sharp drop in growth rate. Smooth films can be obtained at high growth rate (0.5–1 micron/hr) by increasing the $CH_4$ content of the plasma, but the resulting films have an increased graphitic content. Micrographs (see FIGS. 6 and 29) of the films produced using the subject invention show much smaller defect density than conventional films prepared at 300 mTorr with a magnetized plasma using $CH_4$—$H_2$—$O_2$ mixtures as prepared by the applicants herein. The films prepared by the method of the invention also show no evidence of graphite contamination, and exhibit atomically abrupt grain boundaries with no nondiamond intergranular material. The growth rates obtained with the method of the invention were comparable with the high pressure growth rate obtained with the standard method, and 10–100× higher than obtained at 300 mTorr using standard plasma composition.

EXAMPLE VI

The procedure described in Example I was followed except that the chamber pressure was 50 mTorr, using an Ar flow rate >10 sccm with an upper magnet current of 150 A and a lower magnet current of 115 A to improve plasma stability. The microwave power was 500 watts, and the fullerene sublimator heater was operated at 110 volts, resulting in a sublimation source temperature of about 500° C. An intense $C_2$-rich green plasma with an optical emission spectrum similar to that of FIG. 3A was obtained.

EXAMPLE VII

In another method, fullerene rich soot is replaced by a flow of $CH_4$ gas as the source of carbon for the diamond. The experimental conditions for the deposition system 10 (except for lack of the soot 12) are set forth in Table 1 for Films D–G. In other experiments acetylene ($C_2H_2$) was also used under similar conditions as $CH_4$ and diamond was produced.

EXAMPLE VIII

Figure 7:
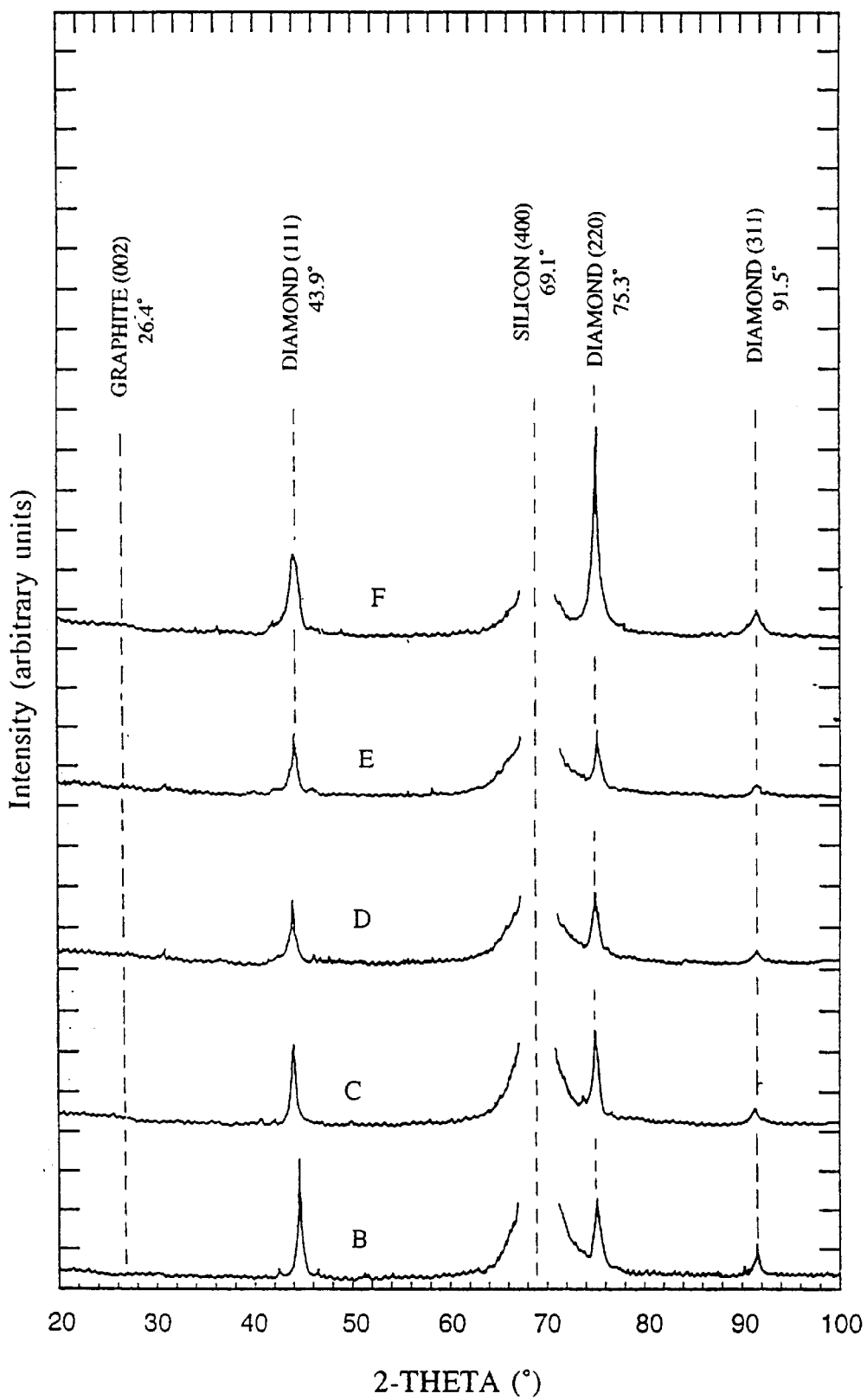
FIG. 7 shows XRD measurements for Films B–F (Table 1) showing diamond as the only crystalline material present in the films; the (400) peak from the silicon substrate has been removed for clarity.

Characterization of the resulting Films A–G are discussed herein. The Films A–G grown or described herein before are characterized as nanocrystalline diamond films. FIG. 7 shows XRD patterns from Films B–F. The characteristic (111), (220) and (311) diamond peaks are evident. The strong Si (400) peak due to the silicon substrate has been removed. There is no evidence of the strong (002) graphite peak at 26.4°. This indicates that the films contain diamond and no appreciable amounts of other crystalline material.

Figure 8A:
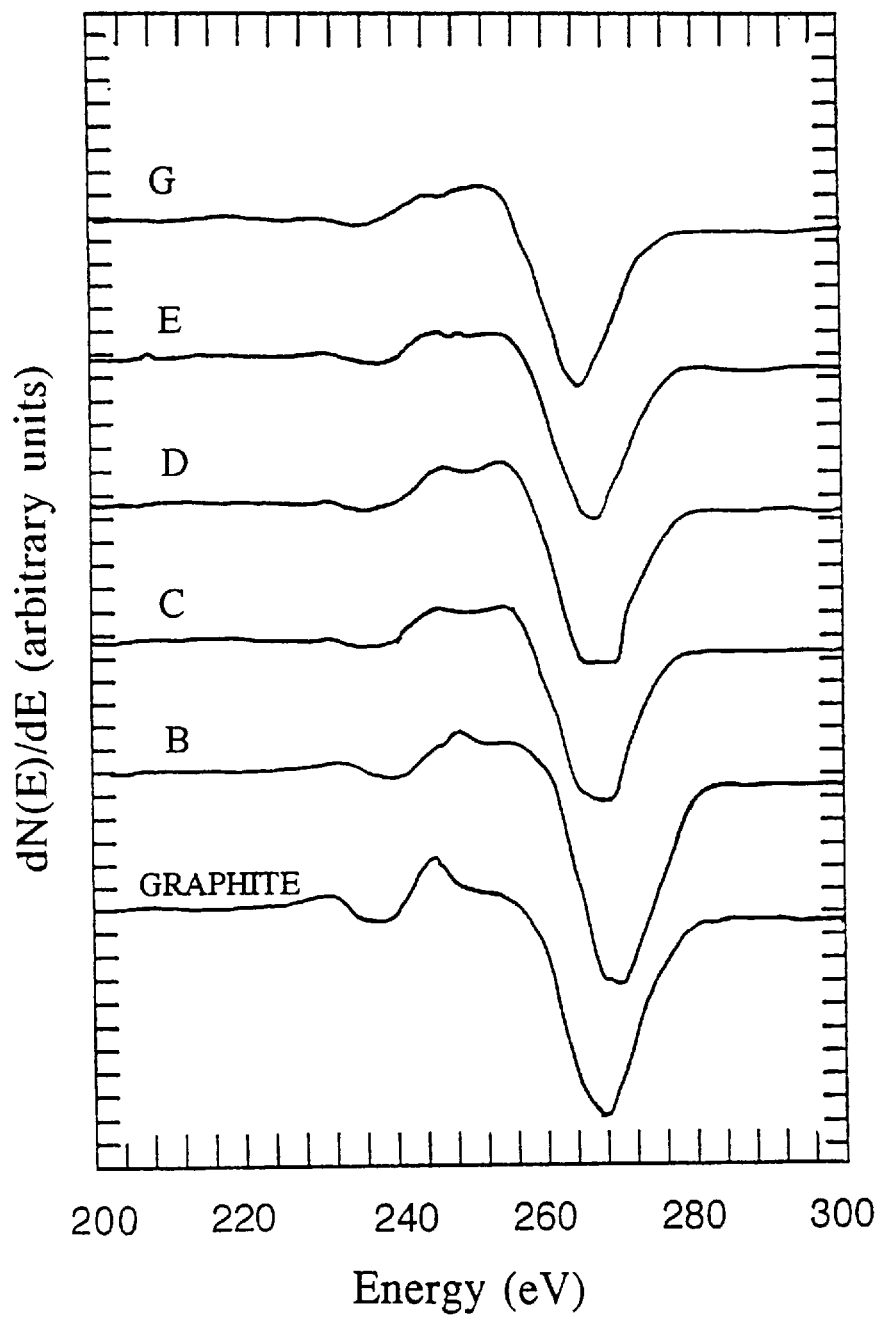
FIG. 8A shows the AES spectra for Films C–E and G to be very similar to diamond; Film B appears to be a hybrid between diamond and graphite, indicating a higher $sp^2/sp^3$ carbon ratio in this film.
Figure 8B:
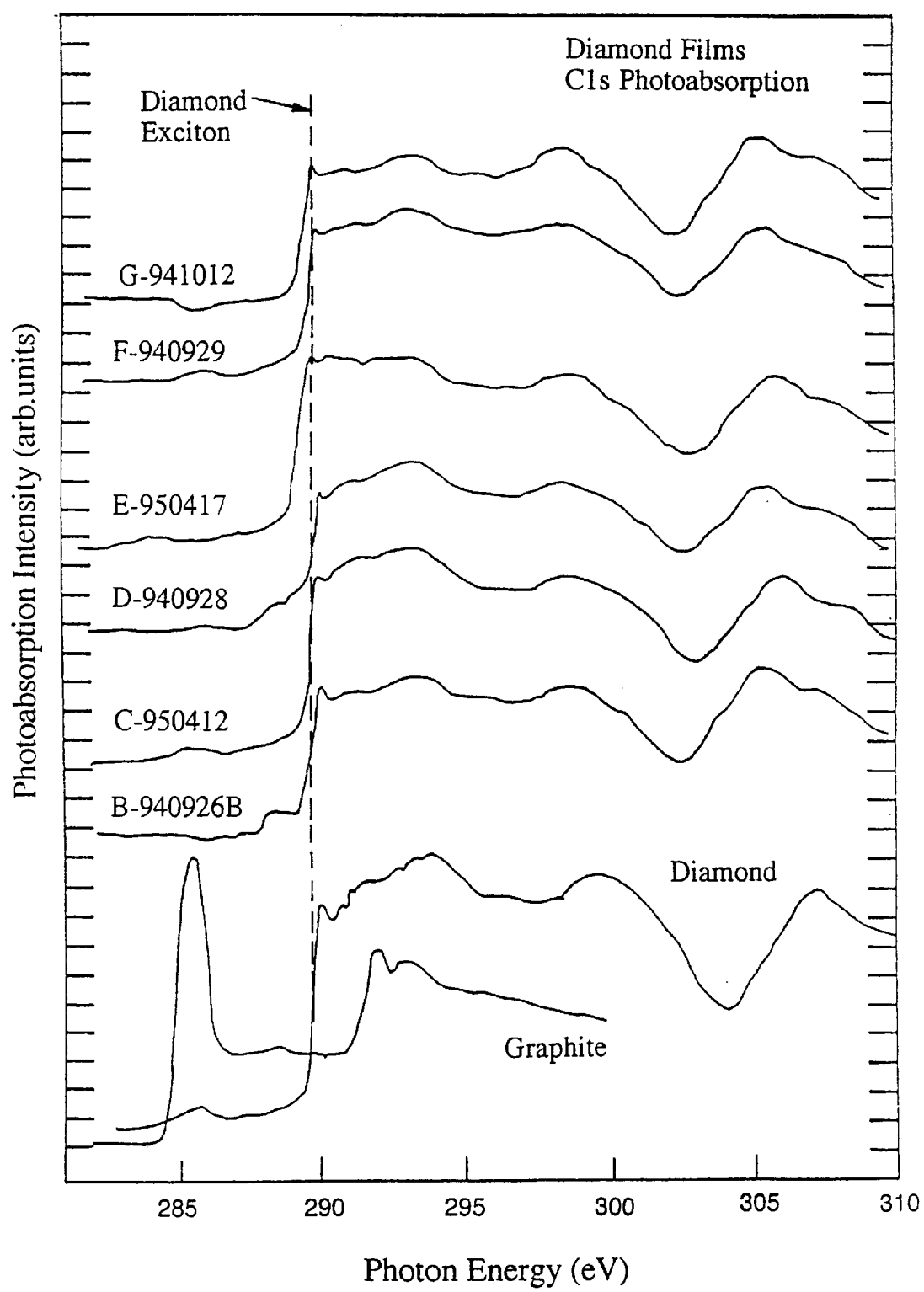
FIG. 8B shows near-edge X-ray absorption fine structure (NEXAFS) data for Films B–G on films deposited under the same conditions as Films B–G, as well as graphite and diamond reference spectra. Films B, D and F have a higher degree of graphitic binding (286 eV) and trapped hydrogen (288 eV) than Films C, E and G.

Evidence of low $sp^2/sp^3$ carbon ratios in the films is obtained from AES measurements of the carbon KLL peak shown in FIG. 8A. The KLL peak is sensitive to the bonding state of the carbon atom and has been used to determine $sp^2/sp^3$ ratios in a C:H films. The AES spectra for Films C–F are very similar to that reported in the literature for diamond, indicating a low $sp^2/sp^3$ ratio. The AES spectrum of Film B appears to be somewhere between diamond and graphite, indicating a higher $sp^2/sp^3$ carbon ratio in this film. Similar results are obtained in the X-ray photo absorption measurements of FIG. 8B, with the added information that the films grown at the lowest hydrogen concentrations (C and E) are both essentially pure diamond and contained no trapped hydrogen, and are indistinguishable from the single crystal diamond reference sample. Films B, D and F by comparison contain significant hydrogen as evidenced by the bump at 289–290 eV, corresponding to C—H bond stretching.

Figure 9:
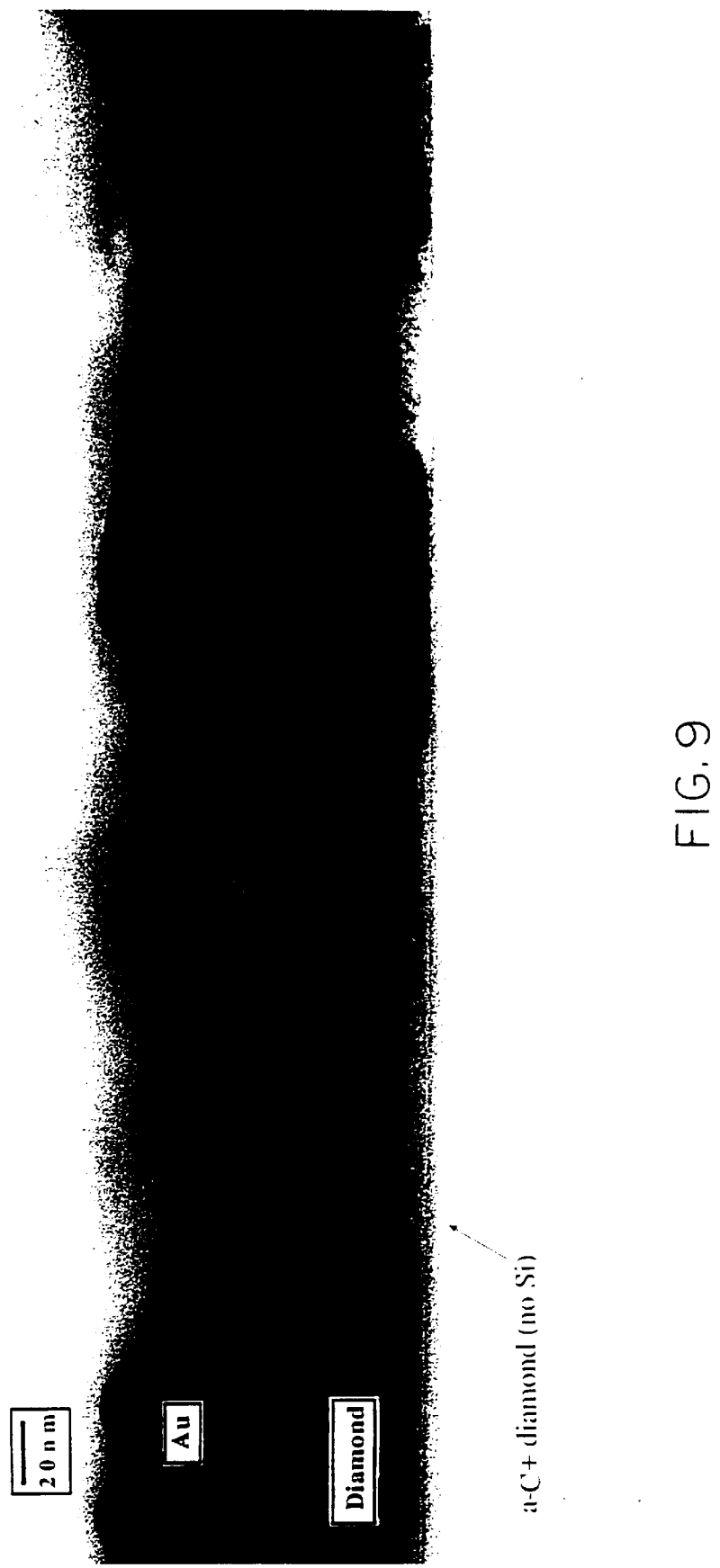
FIG. 9 shows a cross-section HRTEM image of Film A; the silicon substrate has been removed and a gold layer deposited on top; an amorphous carbon layer has formed on top of the silicon before diamond growth began; the diamond grain boundaries are sharp, with no evidence of $sp^2$ carbon; a continuous diamond film was formed at a thickness of 20–30 nm compared to 500–1000 nm required for conventional methods.

High resolution TEM has been used to examine the microstructure of films grown with fullerene precursors and indicates the films are composed of small diamond grains with an average grain size of 15 nm, with extremely clean grain boundaries. FIG. 9 shows a HRTEM image of a section of Film A. The silicon substrate has been removed and a layer of gold deposited on the diamond. A 100 Å thick layer composed of amorphous carbon and diamond was immediately above the silicon substrate and formed preceding diamond film growth. The diamond grains are clearly visible above the amorphous layer and appear as well ordered diamond crystals. The boundaries between the grains are sharp and appear to contain little or no nondiamond phases. This is demonstrated even more clearly by FIG. 29 which shows a grain boundary region at atomic resolution. The lines in this figure are the atomic rows, and the spacing matches that of the bulk diamond lattice, unambiguously demonstrating formation of the diamond phase and the lack of any nondiamond phase at the grain boundary. This further indicates these films are composed of nanocrystalline diamond films with little $sp^2$ carbon present.

Figure 10:
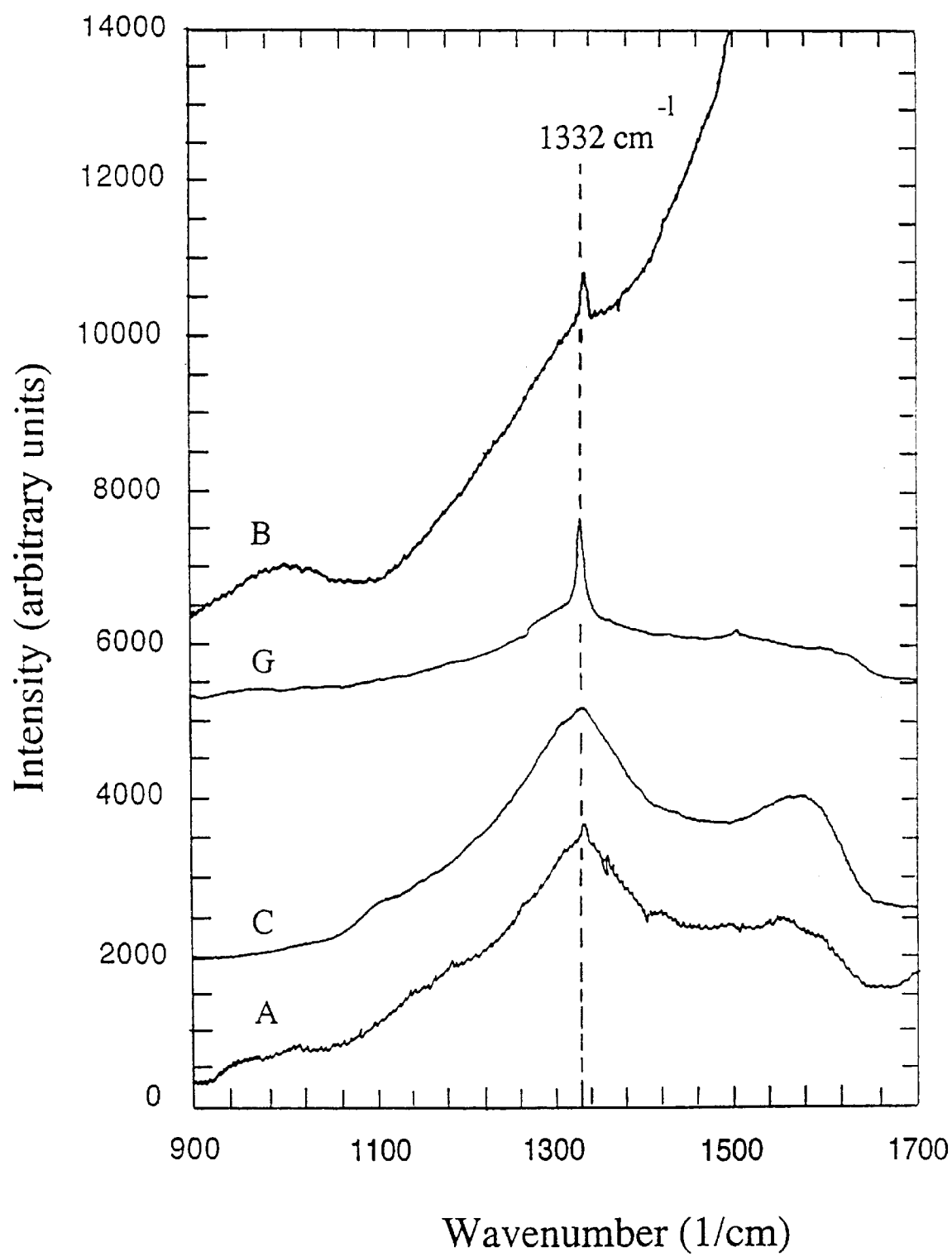
FIG. 10 shows Raman spectra of the films with a diamond peak at 1332 cm$^{-1}$, as well as features at 1580 and 1320 cm$^{-1}$ which are commonly attributed to $sp^2$ carbon. Films A and C show an additional feature at 1140 cm$^{-1}$ which has been attributed to nanocrystalline diamond.

Raman spectra of Films A–C and G which are representative of all the films grown are shown in FIG. 10. Raman spectra of Films E and F are similar to Film C while the Raman spectrum of Film D is similar to Film B. The Raman spectra show a peak at 1332 $cm^{-1}$ attributed to diamond. Features at 1580 and 1330 $cm^{-1}$ have been attributed to $sp^2$ carbon but probably are due to atoms residing at grain boundaries in this nanocrystalline material. An additional feature around 1140 $cm^{-1}$ appears for Films A and C which has been attributed to nanocrystalline diamond. For Film B, an intense fluorescence peak at 2250 $cm^{-1}$ (1.68 eV) results in the rapidly rising background. The weak 1332 $cm^{-1}$ peak relative to other Raman features for films grown at low hydrogen contents (Films A and C) is attributed to the small grain size in the films rather than an increase in the $sp^2/sp^3$ carbon ratio. The 1332 $cm^{-1}$ peak intensity has been shown to decrease with decreasing grain size both for diamond particles of known size and diamond films, where the grain size was determined from XRD measurements. Furthermore, these Raman spectra were excited using 632.8 nm light, which is more sensitive to the nondiamond carbon phases than the 488 nm Argon ion laser light commonly employed for measuring Raman spectra. The present interpretation is supported by the TEM images, which indicate that Film A is nanocrystalline, as well as the NEXAFS, AES and XRD data, which indicate the $sp^2/sp^3$ ratios of the films are similar to diamond and the only crystalline component in the films are diamond.

AFM measurements (see Table 1) of rms surface roughness for Films A–E and G, all grown to ≈2 μm, shows that higher carbon to hydrogen ratios lead to smooth film growth, while lower ratios lead to rougher films. Film F demonstrates that in these low hydrogen content plasmas, a 10 μm thick, smooth (rms roughnesses of 45 nm) film can be grown.

Figure 11A:
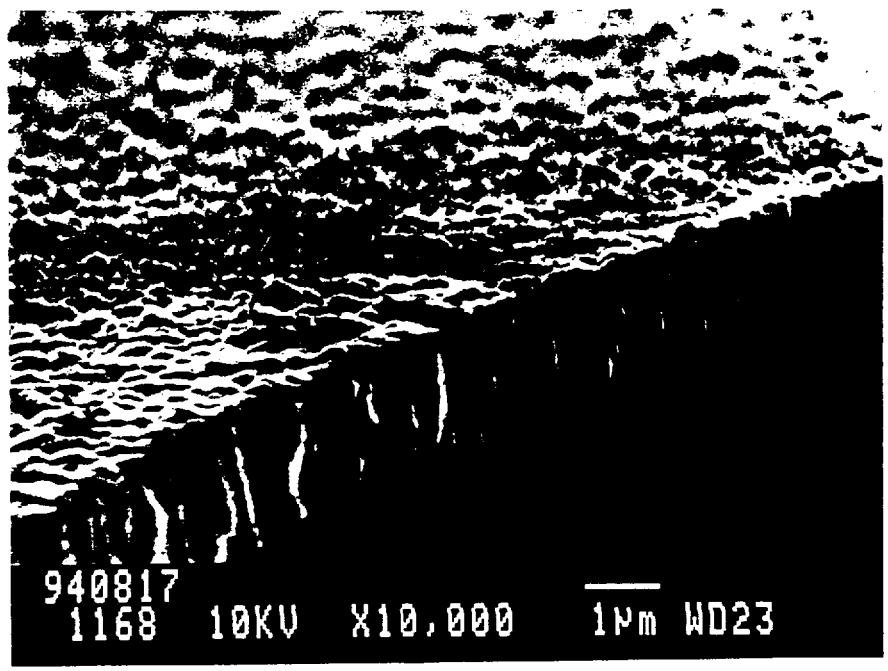
FIGS. 11A and B show SEM micrographs of Film A with FIG. 11A before tribological testing and FIG. 11B the wear track after tribological testing.
Figure 11B:
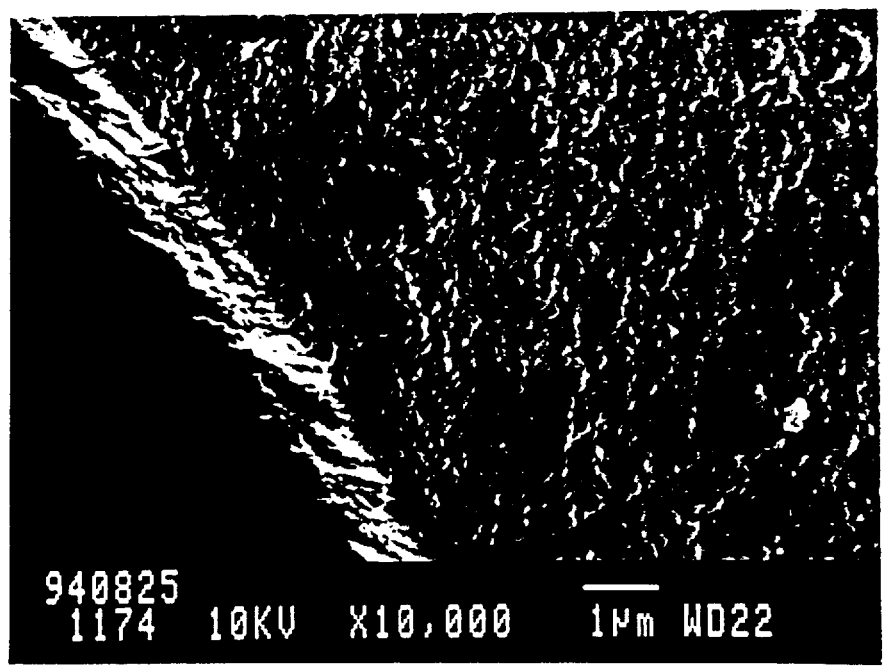

FIG. 11A is a cross-sectional SEM micrograph of Film A. As is clear, the surface of this nanocrystalline diamond Film is rather smooth. FIG. 11B shows that the wear track formed on Film A during tribological testing becomes extremely smooth.

FIG. 12A shows the measured coefficient of friction for conventionally grown polished CVD diamond film as a function of surface roughness. Also shown are the friction coefficients for a cleaved single crystal natural diamond and an unpolished film grown from an Ar—$C_{60}$ plasma. The cleaved natural diamond and the Ar—$C_{60}$ grown film have comparable surface roughness and identical friction properties. As is evident from FIG. 12B, Film G with a rough surface finish exhibits a significantly higher friction coefficient than the smooth Film C in dry $N_2$. As a reference, the friction coefficient of the Si substrate against the $Si_3N_4$ ball is also included in FIG. 12B. The friction coefficient of the rough diamond Film G was somewhat higher than that of the Si substrate, and the wear rate of the counterface material is considerably higher. Table 1 shows the overall frictional performance and ball wear rate for both the rough and smooth diamond films. Again, the highest friction coefficients are due to rough diamond films, whereas the smooth diamond films exhibit friction coefficients of 0.04 to 0.12. We believe that the large fluctuations in the friction traces and very high initial friction coefficients of rough diamond films are largely due to ploughing and interlocking of asperities across the sliding interface. Sharp asperity tips of diamond crystals can dig in and cut the surface of softer counterface material, thus causing severe abrasion and ploughing. It is known that a high degree of ploughing can cause high frictional traction between sliding surfaces. This in turn promotes high friction and severe abrasion of the much softer counterface material. During successive sliding passes, the sharp asperity tips are progressively rounded and eventually blunted to result in a much smoother surface finish. Furthermore, the valleys between asperities are filled with a blanket of wear debris particles. The combination of these two physical phenomena produces a relatively smooth surface finish and eventually results in somewhat lower friction coefficients, although not as low as for diamond films which are intrinsically smooth. This observation is consistent with conventional results which show very high friction coefficients for rough diamond films. In general, prior art found that the greater the surface roughness, the higher the initial and steady-state friction coefficients for diamond films as shown in FIG. 12A.

Owing to their much smoother surface finish, Films A and C exhibit very low friction coefficients, i.e., 0.04 to 0.12, especially at steady-state (see FIG. 12B). These values are comparable to that of a natural diamond in dry $N_2$ as conventionally reported. As shown in FIG. 11A, the surface asperities of these films are not faceted and sharp. Most importantly, the sliding contact surfaces of these films become exceedingly smooth under the influence of repeated sliding (see FIG. 11B). As a result, the extent of frictional losses during sliding against $Si_3N_4$ remain low, especially after a break-in regime of the sliding tests. In short, these films cause much lower ploughing, hence very little fluctuation in friction traces during sliding.

Table 1 lists the wear rates of $Si_3N_4$ balls during sliding against various diamond films. As is evident, compared to smooth diamond films, rough diamond films cause much higher wear losses on counterface balls. This can be attributed to severe abrasion caused by the sharp asperity tips and edges of rough diamond crystals, whereas the smooth films result in much lower wear losses on the $Si_3N_4$ ball, up to 100× lower than previously reported values for conventionally deposited diamond thin films.

While preferred embodiments of the invention have been shown and described, it will be clear to those skilled in the art that various changes and modifications can be made without departing from the invention in its broader aspects as set forth in the claims provided hereinafter.

What is claimed is:

1. A method for manufacturing a nanocrystalline diamond film on a substrate, comprising the steps of:
    (a) forming a carbonaceous vapor selected from the group consisting of a fullerene; fragments thereof; a hydrocarbon selected from the group consisting of $CH_4$, $C_2H_2$ and anthracene; and mixtures thereof;
    (b) providing a gas stream consisting essentially of an inert gas and hydrogen and combining said carbonaceous vapor with said gas stream;
    (c) passing said combined carbonaceous vapor and inert gas stream into a chamber;
    (d) forming a plasma in said chamber, said carbonaceous vapor undergoing interactions in said plasma to form carbon dimer species; and
    (e) depositing said carbon species onto said substrate to form a continuous, nanocrystalline diamond film consisting essentially of carbon in a diamond crystallographic structure.

2. The method as defined in claim 1 wherein said step (a) comprises heating a fullerene containing solid to form said carbonaceous vapor.

3. The method as defined in claim 2 wherein said heating step comprises heating said fullerene containing solid to a temperature of at least about 500° C.

4. The method as defined in claim 1 wherein said inert gas consists essentially of argon.

5. The method as defined in claim 1 wherein said step (d) comprises establishing a microwave field within said chamber.

6. The method as defined in claim 1 wherein said substrate comprises a microtip.

7. The method as defined in claim 6 wherein said microtip is selected from the group consisting of silicon and metal.

8. The method as defined in claim 1 further including adding $H_2$ to the gas stream.

9. The method as defined in claim 8 wherein said hydrogen comprises up to about 19% by volume of the gas stream.

10. The method as defined in claim 1 wherein said step (b) comprises entraining said fullerene vapor in said gas stream.

11. A system for manufacturing a nanocrystalline diamond film on a substrate, comprising:
    a substrate;
    a source for providing a hydrocarbon vapor;
    means for providing an argon and hydrogen gas stream and for combining said hydrocarbon vapor with said gas stream to form a combined gas atmosphere;

a chamber for receiving said combined gas atmosphere; and a microwave energy source for producing a microwave field within said chamber, the microwave field causing formation of a plasma containing excited carbonaceous species and an excited argon and hydrogen gas stream, thereby resulting in accumulation of a continuous, nanocrystalline diamond film on said substrate.

12. The system as defined in claim 11 wherein said substrate comprises a microtip.

13. The system as defined in claim 12 wherein said microtip is selected from the group consisting of silicon and a metal.

14. The system as defined in claim 11 further including a graphite stage including means for heating to control temperature of said substrate.

15. A method for manufacturing a nanocrystalline diamond film on a microtip, comprising the steps of:
   (a) forming a carbonaceous vapor selected from the group consisting of a fullerene and a hydrocarbon selected from the group consisting of $CH_4$, $C_2H_2$ and anthracene;
   (b) providing a gas stream consisting essentially of an inert gas and combining said carbonaceous vapor with said inert gas;
   (c) passing said combined carbonaceous vapor and inert gas into a chamber;
   (d) forming a plasma in said chamber, said carbonaceous vapor reacting in said plasma to form carbon dimer species; and
   (e) depositing said carbon dimer species onto a microtip to form on said microtip a continuous nanocrystalline diamond film having an equiaxed nanocrystalline morphology and consisting essentially of a diamond crystallographic structure.

16. The method as defined in claim 15 wherein said inert gas consists essentially of argon.

17. The method as defined in claim 16 further adding up to 19% by volume of hydrogen to said gas stream.

18. The method as defined in claim 11 where the energy source for producing the plasma may be an RF, AC or DC electric field.

19. The method as defined in claim 11 where the energy source for producing the plasma is selected from the group consisting of an X-ray, UV, visible or infrared electromagnetic wave.

20. The method as defined in claim 1 where the substrate temperature is less than 500° C.

21. A method for manufacturing a nanocrystalline diamond film on a microtip, comprising the steps of:
   (a) forming a carbonaceous vapor selected from the group consisting of a fullerene and a hydrocarbon;
   (b) providing a gas stream including an inert gas and combining said carbonaceous vapor with said inert gas;
   (c) passing said combined carbonaceous vapor and inert gas into a chamber;
   (d) forming a plasma in said chamber, said carbonaceous vapor interacting with said inert gas in said plasma to form carbon dimer species; and
   (e) depositing said carbon dimer species onto a microtip to form on said microtip a continuous, nanocrystalline diamond film having an equiaxed nanocrystalline morphology of a diamond crystallographic structure.

22. A method for manufacturing a nanocrystalline diamond film on a sharp surface, comprising the steps of:
   (a) forming a carbonaceous vapor selected from the group consisting of a fullerene and a hydrocarbon;
   (b) providing a gas stream including an inert gas and combining said carbonaceous vapor with said inert gas;
   (c) passing said combined carbonaceous vapor and inert gas into a chamber;
   (d) forming a plasma in said chamber, said carbonaceous vapor interacting with said inert gas in said plasma to form carbon dimer species; and
   (e) depositing said carbon dimer species onto a sharp surface to form on said sharp surface a continuous, nanocrystalline diamond film having an equiaxed nanocrystalline morphology of a diamond crystallographic structure.

23. A method of depositing a nanocrystalline diamond film on a substrate comprising;
   (a) introducing an inert gas, a hydrocarbon and from 0 to about 20 volume percent hydrogen into a chamber having a substrate therein,
   (b) forming a plasma in said chamber,
   (c) said plasma and gas interacting to deposit a continuous nanocrystalline diamond film on said substrate.

24. The method of claim 23, wherein the hydrogen content is in the range of from about 1 volume percent to about 10 volume percent.

25. The method of claim 24, wherein the hydrocarbon is selected from the class consisting of $CH_4$, $C_2H_2$, anthracene, and mixtures thereof.

26. The method of claim 25, wherein the substrate is maintained at a temperature not greater than about 500° C. during deposition of the diamond film.

27. The method of claim 25, wherein the plasma is formed by microwave energy.

28. The method of claim 25, wherein the diamond film is equiaxed and consists essentially of a diamond crystalline structure.

29. The method of claim 28, wherein the inert gas is Ar, the substrate is maintained at a temperature not greater than about 500° C. during deposition of the diamond film and the plasma is formed by a microwave field established in the chamber.

30. The method of claim 25, and further including introducing a fullerene or fragments thereof into said chamber.

* * * * *